United States Patent
White et al.

(10) Patent No.: US 7,722,925 B2
(45) Date of Patent: May 25, 2010

(54) SHOWERHEAD MOUNTING TO ACCOMMODATE THERMAL EXPANSION

(75) Inventors: John M. White, Hayward, CA (US); William Norman Sterling, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1229 days.

(21) Appl. No.: 11/063,454

(22) Filed: Feb. 23, 2005

(65) Prior Publication Data
US 2005/0183827 A1 Aug. 25, 2005

Related U.S. Application Data

(60) Provisional application No. 60/547,338, filed on Feb. 24, 2004.

(51) Int. Cl.
C23C 16/00 (2006.01)
C23F 1/00 (2006.01)
H01L 21/306 (2006.01)

(52) U.S. Cl. .............................. 427/248.1; 156/345.34

(58) Field of Classification Search ........................ None
See application file for complete search history.

(56) References Cited

U.S. PATENT DOCUMENTS

| | | |
|---|---|---|
| 4,854,263 A | 8/1989 | Chang et al. |
| 5,010,842 A | 4/1991 | Oda et al. |
| 5,310,453 A | 5/1994 | Fukasawa et al. |
| 5,350,480 A | 9/1994 | Gray |
| 5,439,524 A | 8/1995 | Cain |
| 5,449,410 A | 9/1995 | Chang et al. |
| 5,567,243 A | 10/1996 | Foster et al. |

(Continued)

FOREIGN PATENT DOCUMENTS

JP 63-187619 A 8/1988

(Continued)

OTHER PUBLICATIONS

U.S. Appl. No. 11/552,627, filed Oct. 25, 2006, Keller.

(Continued)

*Primary Examiner*—Frederick J. Parker
*Assistant Examiner*—Kelly M Gambetta
(74) *Attorney, Agent, or Firm*—Robert J Stern

(57) ABSTRACT

Methods and apparatus for accommodating thermal expansion of a showerhead. In a first aspect of the invention, the showerhead is movably supported by resting a rim of the showerhead on a support shelf. In a second aspect, the showerhead is suspended from the chamber wall by a plurality of hangers that are connected to the showerhead, the chamber wall, or both by pins that slide within slots so as to permit the hangers to slide radially to accommodate thermal expansion of the showerhead in the radial direction. In a third aspect, the showerhead is suspended from the wall of the vacuum chamber by a plurality of rods or flexible wires. In a fourth aspect, the showerhead is connected near its perimeter to a second material having a greater thermal expansion coefficient than the showerhead. In a fifth aspect, a heater is mounted behind the showerhead to reduce the temperature differential between the top and bottom surfaces of the showerhead or to reduce heat transfer from the workpiece to the showerhead.

20 Claims, 20 Drawing Sheets

U.S. PATENT DOCUMENTS

| | | | |
|---|---|---|---|
| 5,569,356 A | 10/1996 | Lenz | |
| 5,582,866 A | 12/1996 | White | |
| 5,589,002 A | 12/1996 | Su | |
| 5,595,606 A | 1/1997 | Fujikawa et al. | |
| 5,614,026 A | 3/1997 | Williams | |
| 5,628,829 A | 5/1997 | Foster et al. | |
| 5,647,911 A | 7/1997 | Vanell et al. | |
| 5,741,363 A * | 4/1998 | Van Buskirk et al. | 118/715 |
| 5,844,205 A | 12/1998 | White | |
| 5,846,332 A | 12/1998 | Zhao | |
| 5,882,411 A | 3/1999 | Zhao | |
| 5,908,508 A | 6/1999 | Vanell | |
| 5,968,276 A | 10/1999 | Lei | |
| 5,989,652 A | 11/1999 | Ameen et al. | |
| 5,994,678 A | 11/1999 | Zhao | |
| 5,997,642 A | 12/1999 | Solayappan | |
| 5,997,649 A | 12/1999 | Hillman | |
| 5,997,962 A | 12/1999 | Ogasawara et al. | |
| 6,024,044 A | 2/2000 | Law et al. | |
| 6,024,799 A | 2/2000 | Chen et al. | |
| 6,050,216 A | 4/2000 | Szapucki | |
| 6,079,356 A | 6/2000 | Umotoy | |
| 6,093,645 A | 7/2000 | Ameen et al. | |
| 6,106,625 A | 8/2000 | Koai et al. | |
| 6,114,216 A | 9/2000 | Yieh et al. | |
| 6,123,775 A | 9/2000 | Hao | |
| 6,170,432 B1 | 1/2001 | Szapucki | |
| 6,183,563 B1 | 2/2001 | Choi et al. | |
| 6,197,151 B1 | 3/2001 | Kaji | |
| 6,254,742 B1 | 7/2001 | Hanson et al. | |
| 6,302,057 B1 | 10/2001 | Leusink et al. | |
| 6,364,949 B1 | 4/2002 | Or et al. | |
| 6,394,026 B1 | 5/2002 | Wicker | |
| 6,399,520 B1 | 6/2002 | Kawakami | |
| 6,461,435 B1 | 10/2002 | Littau et al. | |
| 6,477,980 B1 | 11/2002 | White et al. | |
| 6,527,908 B2 | 3/2003 | Kanetsuki et al. | |
| 6,673,198 B1 * | 1/2004 | Wicker | 156/345.48 |
| 6,772,827 B2 | 8/2004 | Keller et al. | |
| 6,823,589 B2 | 11/2004 | White et al. | |
| 6,827,815 B2 | 12/2004 | Hytros et al. | |
| 6,838,012 B2 | 1/2005 | Lenz | |
| 6,857,387 B1 | 2/2005 | Sun et al. | |
| 6,942,753 B2 | 9/2005 | Choi et al. | |
| 7,017,269 B2 | 3/2006 | White et al. | |
| 2002/0069968 A1 | 6/2002 | Keller et al. | |
| 2004/0129211 A1 | 7/2004 | Blonigan et al. | |
| 2005/0000432 A1 | 1/2005 | Keller et al. | |
| 2005/0133160 A1* | 6/2005 | Kennedy et al. | 156/345.34 |
| 2006/0060138 A1 | 3/2006 | Keller | |

FOREIGN PATENT DOCUMENTS

JP    9-153481 A    6/1997

OTHER PUBLICATIONS

U.S. Appl. No. 11/552,648, filed Oct. 25, 2006, Keller.
Office Action mailed Dec. 9, 2008 in JP patent application No. 2005-045994 (English translation), 3 pages.

* cited by examiner

SHOWERHEAD MOUNTING TO ACCOMMODATE THERMAL EXPANSION

CROSS REFERENCE TO RELATED APPLICATION

This patent application claims the benefit of U.S. provisional application No. 60/547,338 filed Feb. 24, 2004.

FIELD OF THE INVENTION

The invention relates generally to showerheads for dispensing gas into a plasma chamber or other vacuum chamber used for manufacturing semiconductor devices or other electronic devices. More specifically, the invention relates to methods and apparatus for accommodating or reducing thermal expansion of the showerhead.

BACKGROUND OF THE INVENTION

Electronic devices, such as flat panel displays and integrated circuits, commonly are fabricated by a series of deposition process steps in which layers are deposited on a workpiece and etch process steps in which the deposited material is etched into desired patterns. Such processes generally are performed within a vacuum chamber.

Commonly, the chemical reagents for a deposition or etch process comprise one or more gases, collectively called the process gas, that are dispensed into the vacuum chamber through a showerhead positioned directly above the workpiece. The process gas is dispensed through hundreds or thousands of orifices distributed across the surface of the showerhead so as to produce a desired spatial distribution of the process gas adjacent the workpiece.

In a plasma process, the showerhead also may be electrically connected to an RF power supply so as to function as an electrode. In this case, a reliable low impedance electrical connection must be provided between the showerhead and the RF power supply.

Such an RF-powered showerhead is described in commonly assigned U.S. Pat. No. 4,854,263 issued Aug. 8, 1989 to Chang et al.

Typically, the workpiece is substantially flat, and the showerhead has a surface facing the workpiece (referred to herein as the "front surface" of the showerhead) that also is substantially flat. Alternatively, the front surface of the showerhead may have a slight convex or concave curvature intended to maximize spatial uniformity of the deposition or etch process being performed on the workpiece.

The showerhead generally will be heated by the process being performed in the vacuum chamber. In non-plasma processes, the workpiece is heated by some means such as electrical resistance heating or radiant heating, which generally produces some heat transfer to the showerhead. In plasma processes, the plasma is an additional source of heat.

Heating generally causes thermal expansion of the showerhead, which can distort the original contour (i.e., flatness or curvature) of the front surface of the showerhead. Such distortion is undesirable because it may impair the spatial uniformity of the process being performed on the workpiece.

Distortion of the flatness or curvature of the front surface of the showerhead is especially likely to occur if the perimeter of the showerhead is rigidly mounted to the wall of the vacuum chamber, as in many conventional designs. Because the perimeter is fixed, thermal expansion of the showerhead will cause the showerhead surface to bow.

One solution to this problem of distortion of the flatness or curvature of the front surface of the showerhead in response to thermal expansion is to mount the showerhead by means of a flexible sheet, as described in commonly-assigned U.S. Pat. No. 6,772,827.

A flexible sheet requires some care in handling to avoid damage to the sheet. Accordingly, there is a need for alternative designs that are easier to handle.

SUMMARY OF THE INVENTION

In a first aspect of the invention, described in Sections 2 and 3 of the Detailed Description of the Preferred Embodiments, the showerhead or diffuser is supported by resting a rim of the showerhead on a support shelf. The showerhead rim is free to slide across a surface of the support shelf, thereby enabling the showerhead to radially expand and contract in response to temperature changes with little or none of the stress and bowing force that would occur if the showerhead had a fixed, non-sliding mounting to the chamber. Consequently, the invention can minimize or eliminate any distortion of the contour (i.e., the flatness or curvature) of the front surface of the showerhead due to thermal expansion or contraction.

In a second aspect of the invention, described in Section 4 of the Detailed Description, the showerhead is suspended from the chamber wall by a plurality of hangers that are connected to the showerhead, the chamber wall, or both by pins that slide within slots so as to permit the hangers to slide radially to accommodate thermal expansion of the showerhead in the radial direction.

In a third aspect of the invention, described in Section 5 of the Detailed Description, the showerhead is suspended from the wall of the vacuum chamber by a plurality of flexible wires.

In a fourth aspect of the invention, described in Section 6 of the Detailed Description, the showerhead is suspended from the wall of the vacuum chamber by a plurality of rods. The upper end of each rod is mounted to the vacuum chamber via a first articulating joint, and the lower end of each rod is mounted to the showerhead via a second articulating joint. The articulating joints permit the rods to pivot in response to thermal expansion of the showerhead.

In a fifth aspect of the invention, described in Section 7 of the Detailed Description, the showerhead is connected near its perimeter to a second material having a greater thermal expansion coefficient than the showerhead. Although the second material generally will not be heated as much as the showerhead, its greater thermal expansion coefficient can enable it to expand approximately the same amount as the showerhead in response to heat from processes performed in the chamber. This design for mounting the showerhead accommodates thermal expansion of the showerhead without requiring a sliding or flexible suspension.

In a sixth aspect of the invention, described in Section 8 of the Detailed Description, a heater is mounted behind the showerhead. One advantage of the heater is that elevating the temperature of the showerhead reduces heat transfer from the workpiece to the showerhead. Another advantage of the heater is that it can prevent the front surface of the showerhead from becoming hotter than the back surface of the showerhead due to heat transfer from the process being performed within the chamber, thereby reducing or eliminating bowing of the front surface due to a temperature differential between the front and back surfaces.

DETAILED DESCRIPTION OF THE PREFERRED EMBODIMENTS

1. Plasma Chamber Overview

Figure 1:
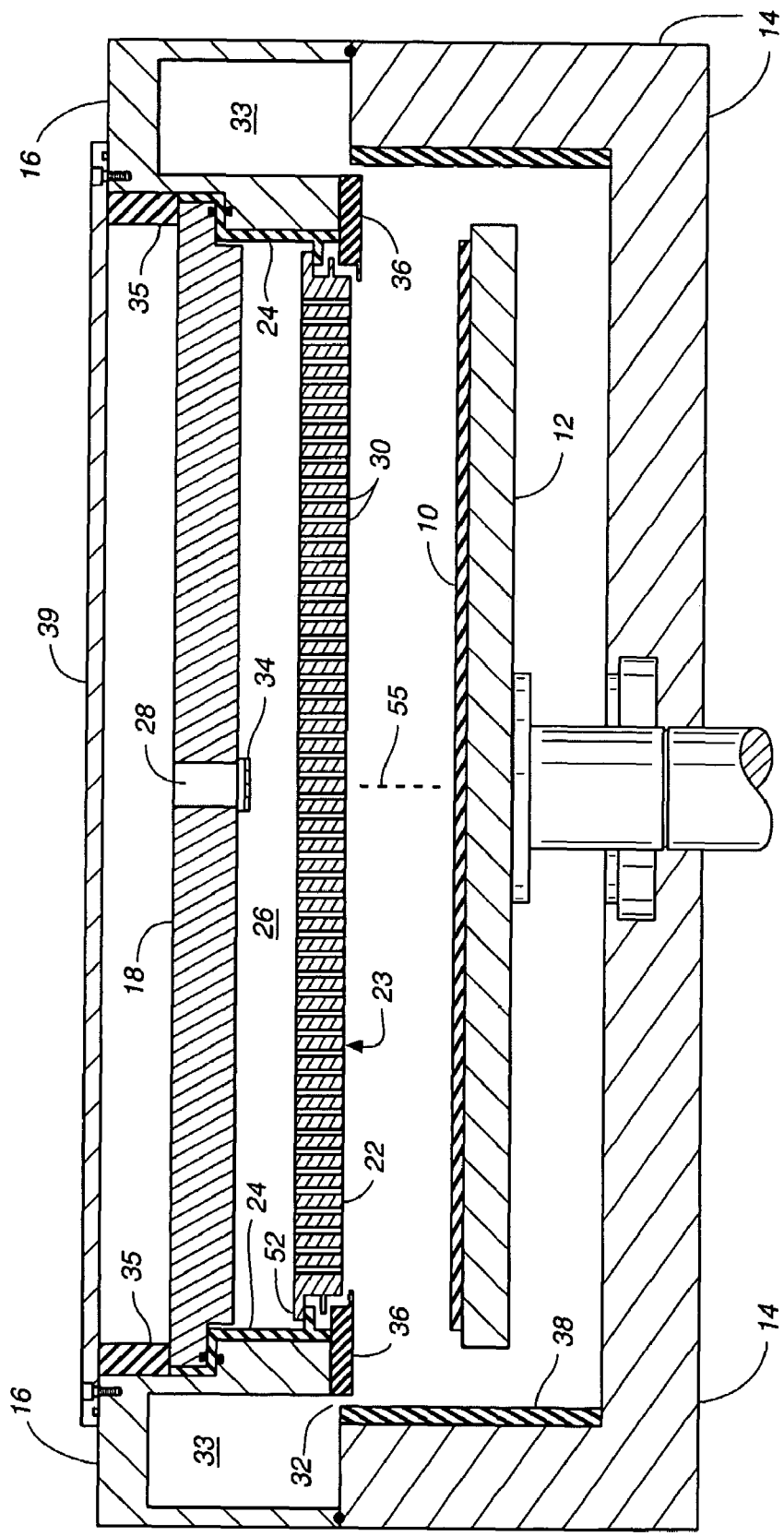
FIG. 1 is a sectional, partially schematic side view of a plasma chamber that includes the a showerhead supported by a showerhead rim that slidably rests on a support shelf.

FIG. 1 shows a vacuum chamber that includes a showerhead suspended according to one embodiment of the invention in which hangers attached to the showerhead are free to slide over a shelf attached to the chamber wall. Before describing the novel suspension, the other components of the vacuum chamber will be described.

The vacuum chamber is intended to subject a workpiece or substrate 10 to a chemical process that is one step in a sequence of steps in the fabrication of semiconductor or other electronic devices on the workpiece. The workpiece is supported within the chamber by a workpiece support 12, also called a chuck or susceptor. Common examples of a workpiece 10 that would be processed within the chamber include a rectangular glass substrate on which flat panel displays are fabricated or a circular semiconductor wafer on which integrated circuits are fabricated.

The vacuum chamber has a housing or chamber wall that provides a vacuum enclosure for the chamber interior. In the illustrated embodiment, the side and bottom walls of the chamber are implemented as a unitary wall 14. The top portion of the chamber wall is provided by a hinged lid 16 and a gas inlet manifold top wall 18. Personnel can access the interior of the chamber by raising the lid 16. O-rings 19 (some not shown) provide vacuum seals between the side wall 14, lid 16, and gas inlet manifold top wall 18. The side and bottom wall 14, lid 16, and gas inlet manifold top wall 18 are all considered portions of the chamber wall.

When referring to different sides or surfaces of a component of the chamber within this patent specification, we use the terms "front" and "back" to refer to sides or surfaces facing toward the workpiece and away from the workpiece, respectively. For example, the top surface of the workpiece support 12 is called the front surface of the workpiece support, and the lower and upper surfaces of the showerhead 22 are respectively called the front surface 23 of the showerhead and the back surface of the showerhead.

In performing a process for fabricating semiconductors or other electronic devices on the workpiece, one or more gases are dispensed into the chamber through a gas inlet manifold. The gas inlet manifold includes the gas inlet manifold top wall 18 through which gas enters the gas inlet manifold and a showerhead 22 (also called a diffuser or gas distribution plate) through which gas flow from the gas inlet manifold to the interior of the plasma chamber. The gas inlet manifold further includes a gas inlet manifold side wall, also referred to as the gas sealing side wall, that provides a gas seal extending between the top wall 18 and the showerhead 22. The gas inlet manifold top wall, side wall and showerhead collectively enclose a volume referred to as the interior region or plenum 26 of the gas inlet manifold.

An external gas source, not shown, supplies the process gas to at least one gas inlet orifice 28 in the gas inlet manifold top wall 18, through which the process gas flows into the plenum 26 of the gas inlet manifold. The process gas then flows from the plenum into the interior of the chamber through one or more, typically hundreds or thousands, of gas outlet orifices 30 in the showerhead 22.

In the embodiment of FIGS. 1-5, the gas sealing side wall of the gas inlet manifold consists primarily of the dielectric liner 24 that covers the inner surface of the chamber lid 16. In the alternative embodiment of FIG. 6, the gas inlet manifold side wall consists primarily of a hanger 70 that will be described below. In the various embodiments of FIGS. 12-14 and 17-20, a flexible sheet 88 functions as the gas sealing side wall of the gas inlet manifold.

The side wall of the gas inlet manifold should provide a sufficiently gas-tight seal—that is, a sufficient impedance to gas leakage—so that most of the gas that flows into the plenum through the gas inlet orifice 28 will enter the interior of the vacuum chamber by flowing through the showerhead gas outlet orifices 30 rather than by leaking through gaps in the gas inlet manifold side wall. The amount of leakage that is acceptable depends on the process being performed on the workpiece, but in most processes the leakage should be less than ten percent. That is, less than ten percent (one-tenth) of the gas entering the plenum through the gas inlet orifice 28 should leak through the gas inlet manifold side wall, so that at least ninety percent of the gas should be dispensed into the vacuum chamber through the gas outlet orifices 30. At worst, no more than forty percent of the gas entering the plenum should leak through the gas inlet manifold side wall.

A conventional vacuum pump, not shown, maintains a desired level of vacuum within the chamber and exhausts the process gases and reaction products from the chamber through an annular exhaust slit 32, then into annular exhaust plenum 33, and then through an exhaust channel, not shown, to the pump.

In the illustrated preferred embodiments, the showerhead 22 is an aluminum plate that is 3 cm thick. Preferably it should be thick enough so that it is not significantly deformed under atmospheric pressure when a vacuum is created within the chamber.

Some types of workpiece fabrication process performed in such a chamber, such as thermal chemical vapor deposition (thermal CVD) processes, are performed in the absence of a plasma. Many other processes, such as plasma-enhanced chemical vapor deposition (PECVD) or plasma etch processes, do require a plasma. Vacuum chambers intended for use in plasma processes are called plasma chambers.

In one type of plasma chamber, a plasma is generated or sustained within the chamber by capacitively coupling electrical power to the plasma by means of a radio frequency (RF) power supply connected to electrodes within the chamber. In such plasma chambers, the showerhead generally functions as one of the electrodes, either by being connected to the electrically grounded chamber wall, or else by being electrically insulated from the chamber wall and being electrically connected to an ungrounded (RF hot) output of the RF power supply. Consequently, it is important to provide electrical contact to the showerhead of sufficient conductivity and reliability to conduct high levels of radio frequency power, typically on the order of a kilowatt.

The gas outlet orifices 30 in the showerhead should have a diameter smaller than the width of the plasma dark space in order to prevent plasma within the plasma chamber from entering the plenum 26, i.e., the interior region of the gas inlet manifold between the showerhead 22 and the top wall or top wall 18 of the gas inlet manifold. The width of the dark space, and therefore the optimum diameter of the gas outlet orifices, depends on chamber pressure and other parameters of the specific semiconductor fabrication processes desired to be performed in the chamber. Alternatively, to perform plasma processes using reagent gases that are especially difficult to dissociate, it may be desirable to employ orifices having a narrow inlet and a wider, flared outlet as described in the above-referenced U.S. Pat. No. 4,854,263 to Chang et al.

Preferably the gas inlet manifold also includes a gas inlet deflector consisting of a circular disc 34 having a diameter slightly greater than that of the gas inlet orifice 28 and suspended below the orifice by posts, not shown. The deflector blocks gases from flowing in a straight path from the gas inlet 28 to the directly adjacent gas outlet orifices 30 in the center of the showerhead, thereby helping to equalize the respective gas flow rates through the center and periphery of the showerhead.

In applications in which the gas inlet manifold top wall and showerhead are RF hot, dielectric liners 24, 35 are mounted between those RF hot components and the electrically grounded chamber lid 16. To concentrate the plasma in the region of the chamber between the workpiece support 12 and the showerhead, other metal surfaces in the chamber that are near the showerhead or the workpiece support commonly are covered with dielectric liners. For example, FIG. 1 shows a dielectric liner 36 covering the underside of the chamber lid 16 and a dielectric liner 38 covering the chamber side wall 14.

A cover 39 generally is attached to the top of the chamber lid 16 to protect personnel from accidental contact with the RF hot top wall 18 or showerhead. The cover 39 will not be discussed further because the cover is unimportant to the functionality of the other chamber components discussed herein.

The chamber components should be composed of materials that will not contaminate the semiconductor fabrication processes to be performed in the chamber and that will resist corrosion by the process gases. Aluminum is our preferred material for all of the components other than the O-rings and the dielectric spacers and liners, which will be described below.

The design and operation of conventional plasma CVD and etch chambers are described in the following commonly-assigned U.S. patents, the entire content of each of which is hereby incorporated by reference in this patent specification: U.S. Pat. No. 5,844,205 issued Dec. 1, 1998 to White et al.; and U.S. Pat. No. 4,854,263 issued Aug. 8, 1989 to Chang et al.

2. Sliding Support for Showerhead

As stated above in the section entitled "Background of the Invention", heat from the process being performed in the chamber causes thermal expansion of the showerhead 22. If the showerhead is mounted rigidly and inflexibly to the chamber wall 18, such thermal expansion can cause the showerhead to bow so that the front surface or lower surface 23 of the showerhead is deformed, i.e., so that the flatness or curvature of the lower surface is altered or distorted.

Figure 2:
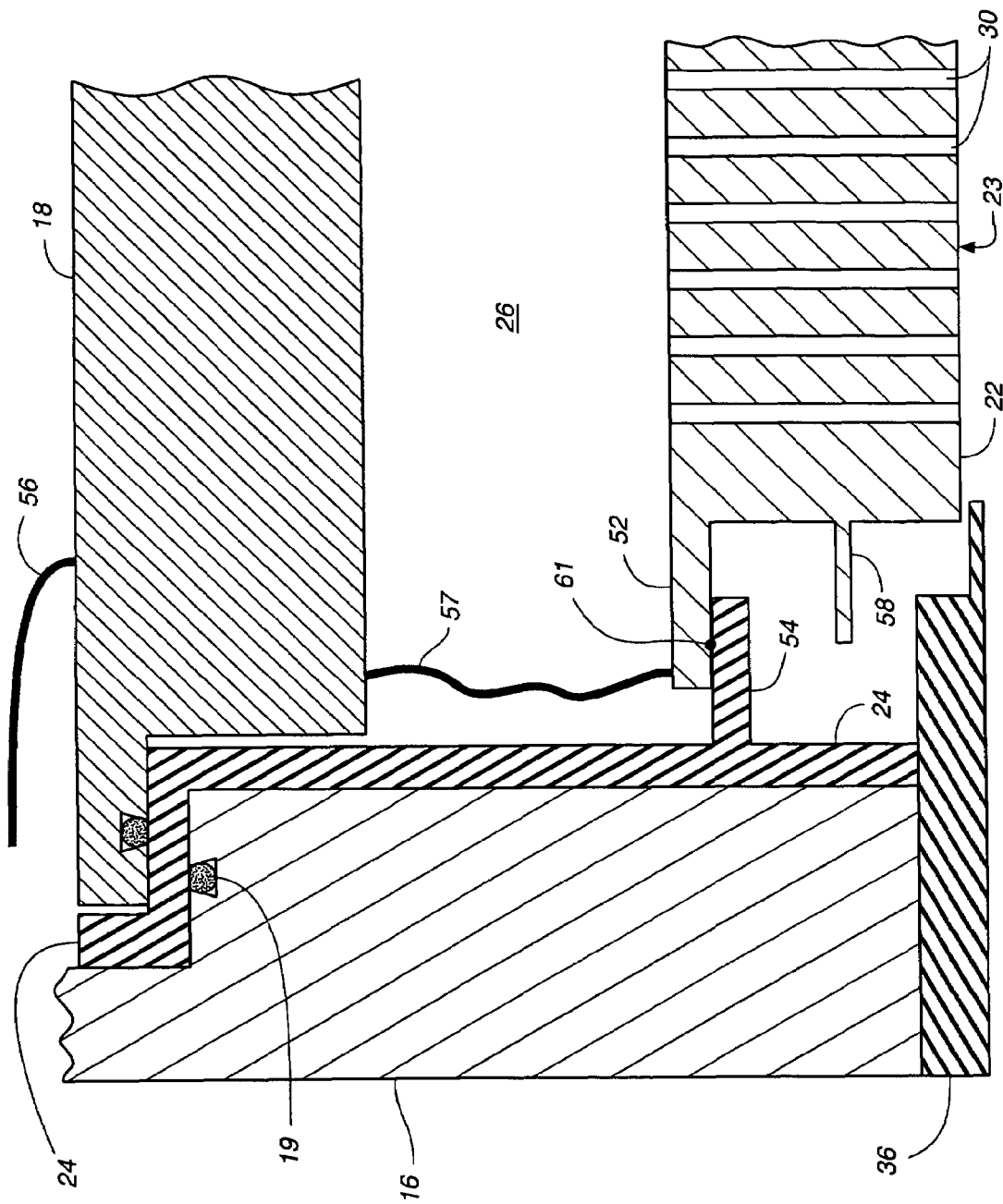
FIG. 2 is a vertical sectional detail of the showerhead rim and support shelf of FIG. 1.
Figure 3:
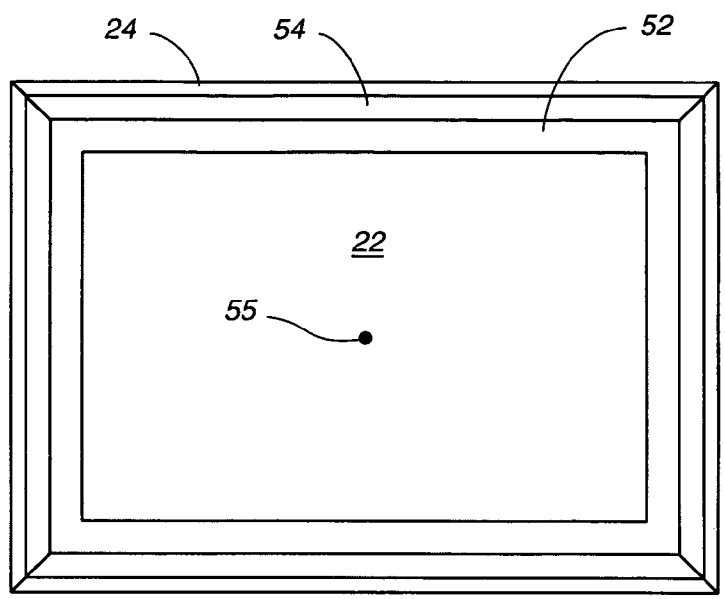
FIG. 3 is a top view of only the rectangular showerhead and support shelf of FIG. 2.

FIGS. 1-3 depict one solution to this problem, which is to support the showerhead by resting a circumferential rim 52 of the showerhead on a showerhead support shelf 54 so that the showerhead rim is free to slide across the top surface of the shelf. Consequently, when the showerhead radially expands and contracts in response to changes in its temperature, the showerhead rim slides outwardly and inwardly, respectively, across the shelf. This freedom to slide substantially eliminates stress on the showerhead in response to such radial thermal expansion and contraction.

The shelf 54 can be attached to any portion of the vacuum chamber that is capable of supporting the weight of the showerhead. Preferably, the shelf is directly or indirectly attached to the chamber wall 18. In the illustrated preferred embodiment, the shelf is an inwardly projecting extension of the dielectric liner 24 that covers the inner surface of the lid 16.

As explained in U.S. Pat. No. 6,477,980, it is desirable to minimize heat transfer from the perimeter of the showerhead 22 to any cool components of the vacuum chamber (such as the chamber lid 16 and chamber side wall 14) to which the showerhead is directly or indirectly mounted. Specifically, the structures that mount and support the showerhead within the vacuum chamber preferably should interpose a high thermal impedance between the showerhead and such cool chamber components. Minimizing such heat transfer is advantageous for at least two reasons: first, to maximize the temperature of the showerhead so as to minimize heat loss from the workpiece to the showerhead; and second, to maximize the spatial uniformity of the temperature of the lower surface of the showerhead by minimizing the extent to which the perimeter of the showerhead loses heat faster than the center of the showerhead.

Applying this principle to the present invention, the support shelf 54 or any components between the support shelf and any large, cool components of the chamber (such as the chamber lid 16 and chamber side wall 14) preferably should interpose a high thermal impedance between the showerhead and those cool components. In the illustrated embodiment of FIG. 3, this is accomplished by fabricating the dielectric liner 24 and its integral support shelf 54 of a dielectric material having a low thermal conductivity, so that the dielectric liner and support shelf interpose a high thermal impedance between the showerhead and the chamber lid 16.

As stated in the preceding Section 1, one or more process gases are dispensed into the chamber through the gas inlet manifold. The gas inlet manifold includes the gas inlet manifold top wall 18, a showerhead 22 (also called a diffuser or gas distribution plate), and a gas sealing side wall that extends between the top wall 18 and the showerhead so that the gas inlet manifold side wall, top wall and showerhead collectively enclose a volume referred to as the plenum 26 or the interior region of the gas inlet manifold. In the embodiment of FIGS. 1-5, the gas inlet manifold side wall consists primarily of the dielectric liner 24, the support shelf 54, and the showerhead rim 52.

As also stated in the preceding Section 1, the gas sealing side wall of the gas inlet manifold should provide a sufficiently gas-tight seal so that most of the gas that flows into the plenum through the gas inlet orifice 28 will enter the interior of the vacuum chamber by flowing through the showerhead gas outlet orifices 30 rather than by leaking through gaps in the side wall of the gas inlet manifold. Consequently, the showerhead rim 52 and the showerhead support shelf 54 should not have excessively large gaps, either within any one component or between adjacent components, through which an excessive portion of the process gas can leak from the plenum. Preferably, less than ten percent (one-tenth) of the gas entering the plenum through the gas inlet orifice 28 should leak through the gas inlet manifold side wall, so that at least ninety percent of the gas should be dispensed into the vacuum chamber through the gas outlet orifices 30. Therefore, the combined cross-sectional area of the aforesaid gaps (the "side wall gap area") preferably should be less than ten percent (one-tenth) of the combined cross-sectional area of the narrowest portion of the outlet orifices of the showerhead (the "showerhead orifice area"). At worst, the side wall gap area should be less than forty percent of the showerhead orifice area.

Both the rim and the shelf can be fabricated as one continuous piece, or else can be fabricated as multiple pieces which closely abut so as to create a sufficiently gas tight seal. For example, FIG. 3 illustrates the showerhead rim 52 being a continuous piece, while the dielectric liner 24 from which the support shelf 54 projects has four distinct pieces which respectively cover the four inner surfaces of the rectangular chamber lid 16. The showerhead rim 52 can be machined as an integral part of the showerhead, or it can be a rectangular frame with an open center that is attached to the showerhead near its perimeter.

Figure 4:
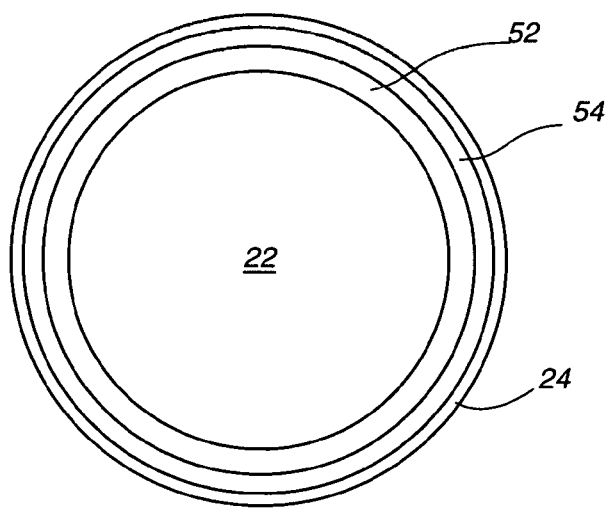
FIG. 4 is a top view of a variation on the FIG. 3 design in which the showerhead is cylindrical, showing only the showerhead and support shelf.

FIG. 4 shows how this design can be adapted to a showerhead 22 that is cylindrical rather than rectangular. In this embodiment, the showerhead rim 52, showerhead support shelf 54, and dielectric liner 24 are all cylindrical and concentric with the showerhead 22.

To provide a reliable, high conductivity RF electrical connection to the showerhead, an RF electrical cable 56 (referred to as the upper cable) can be electrically connected to the top wall 18 of the gas inlet manifold, and a second RF cable 57 (referred to as the lower cable) can be directly connected between the top wall 18 and the showerhead, as shown in FIG. 2.

Friction in the sliding contact between the showerhead rim 52 and the showerhead support shelf 54 can abrade the contacting surfaces to produce particles. The dielectric liner 36 that covers the underside of the chamber lid 16 preferably extends at least partially under the shelf 54 so as to catch most or all of such particles to prevent them from falling onto the workpiece 10. Optionally, the showerhead can include a second circumferential rim or trough 58 located below the first rim 52 so as to catch particles that might be missed by the dielectric liner 36.

To reduce friction and abrasion between the lower surface of the showerhead rim 52 and the upper surface of the showerhead support shelf 54, a smooth, low friction glide or bearing 61 can be attached to either or both of these surfaces. For example, the glide can be a rod or one or more balls embedded in one of these surfaces. Optionally, the glide can be fitted in a socket within such surface that allows the glide to freely roll within the socket.

Figure 5:
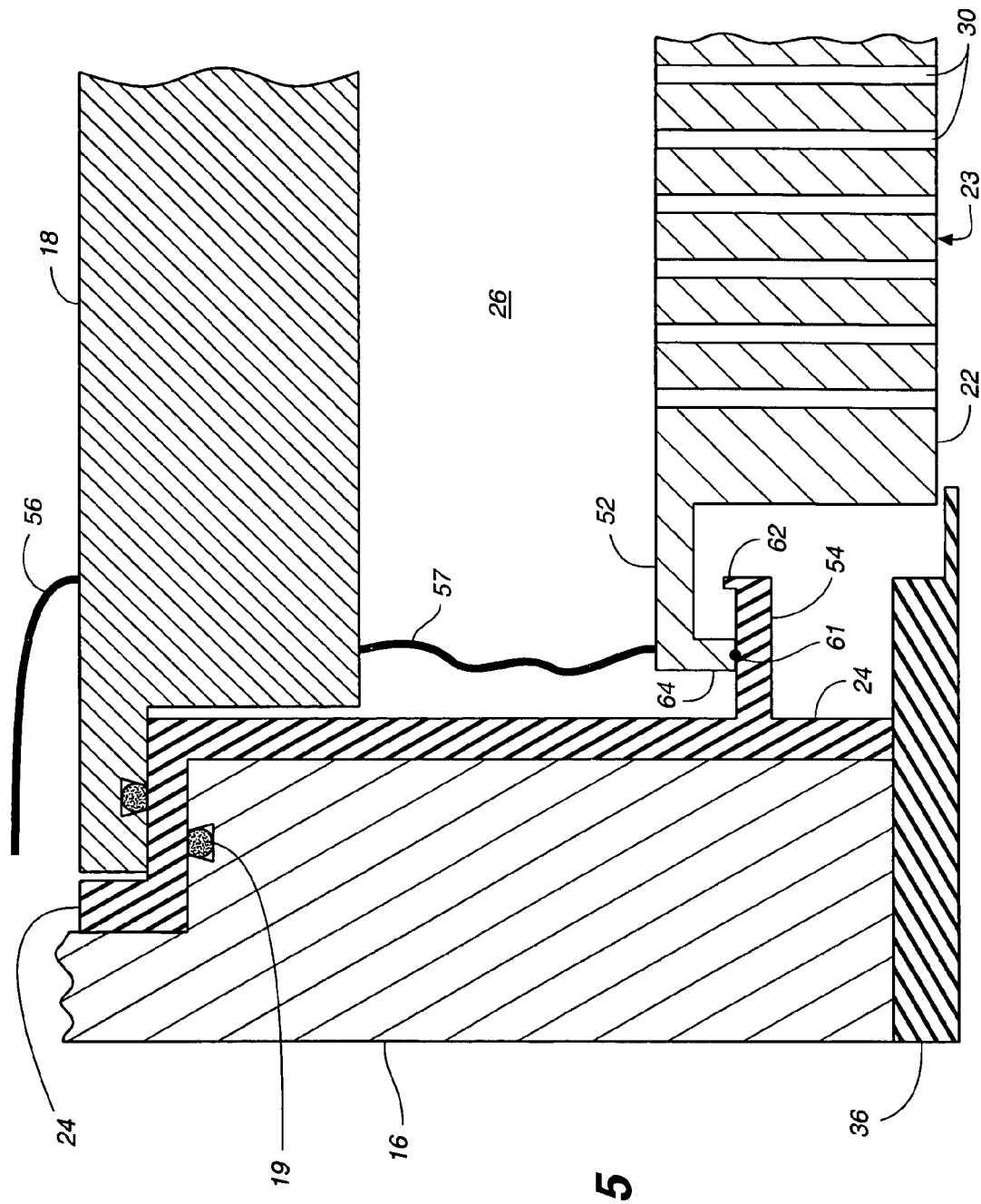
FIG. 5 is a vertical sectional detail of an improved version of the showerhead rim and support shelf that further includes lips to prevent particles from falling.

FIG. 5 shows an alternative version of the design of FIG. 2 in which the inner end of the showerhead support shelf 54 has an upward extending lip 62 to ensure that particles generated by abrasion between the shelf and the showerhead rim 52 are caught by the shelf so that they do not fall onto the workpiece. To provide clearance for the lip 62 of the shelf, the outer end of the showerhead rim 52 should have a circumferential lip 64 that extends downward by an amount at least slightly greater than the height of the shelf lip 62, so that the lower end of the showerhead lip 64 is the only point of contact between the showerhead rim 52 and the support shelf 54. The showerhead lip 64 should rest on an upwardly facing surface of the support shelf 52 that is radially outward of the support shelf lip 62. Preferably, a glide 61 as described above is attached to the lower surface of the showerhead lip 64.

To prevent the raised lip 62 of the support shelf from striking the side of the showerhead and thereby producing particles when the showerhead slides outward, the showerhead rim 52 preferably should have a radial width greater than the radial width of the support shelf. More specifically, the lip 64 of the showerhead rim should be spaced radially outward of the side of the showerhead by an amount greater than the radial width of the support shelf upper surface along which the showerhead lip 64 slides.

3. Hanger Suspends Showerhead Support Shelf from Top Wall

Figure 6:
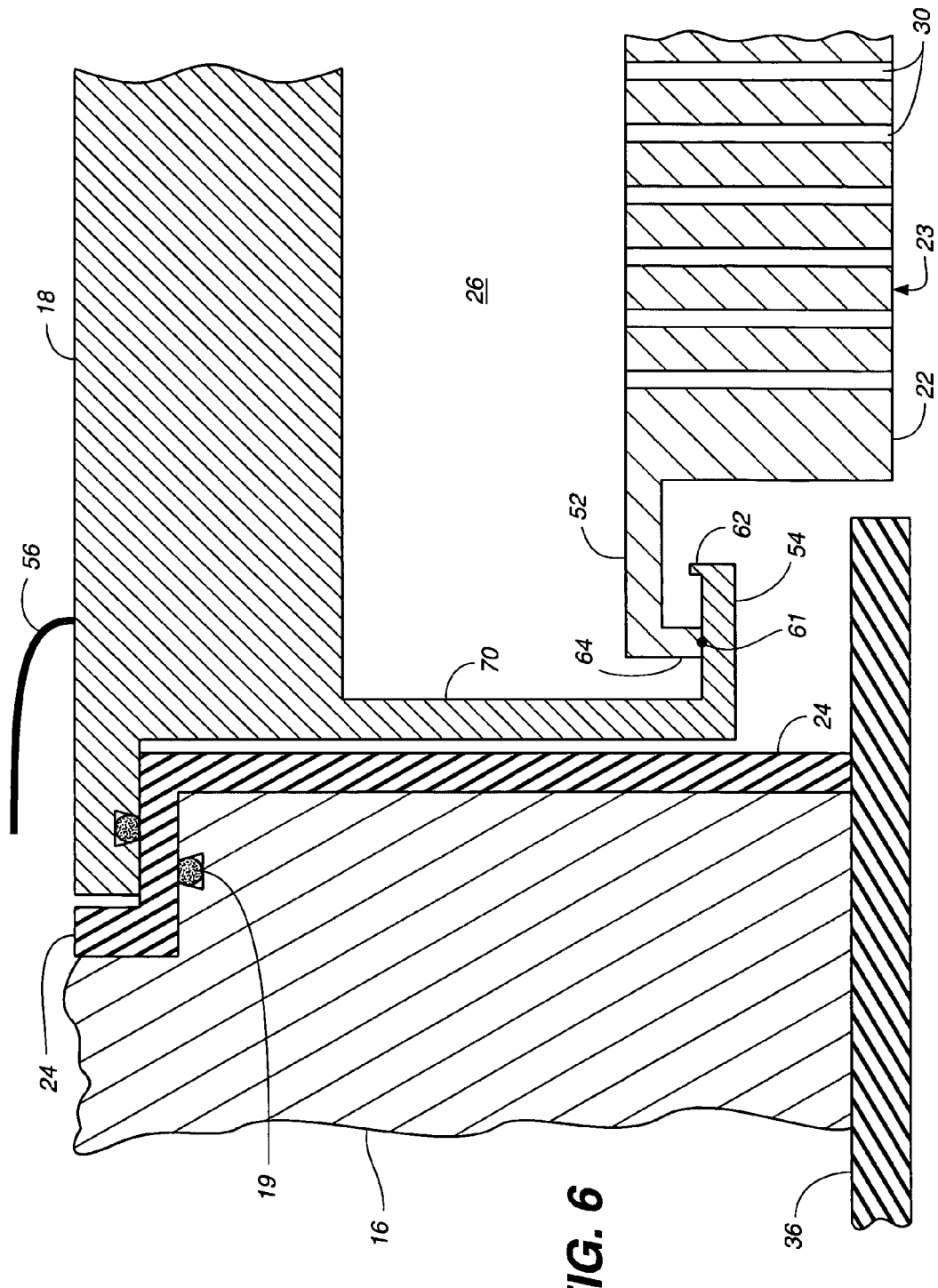
FIG. 6 is a vertical sectional detail of an alternative embodiment of the showerhead rim and support shelf of FIG. 5 in which a hanger attaches the support shelf to the gas inlet manifold top wall.

FIG. 6 shows an alternative embodiment which is identical to the embodiment of FIG. 5, except that the showerhead support shelf 54 is not attached to the dielectric liner 24. Instead, the showerhead support shelf 54 is suspended from the top wall 18 of the gas inlet manifold by a hanger 70. The FIG. 6 embodiment accommodates radial thermal expansion of the showerhead in the same manner as the embodiments of FIGS. 1-5 by permitting the showerhead rim 52 to slide across the surface of the support shelf 54 on which it rests. Except for the differences described below, all of the variations and design considerations discussed in connection with the embodiments of FIGS. 1-5 also apply to the embodiment of FIG. 6.

If the top wall 18, hanger 70, support shelf 54, glide 61, and showerhead rim 52 are all composed of electrically conductive material such as aluminum or other metal, these components will electrically connect the top wall 18 to the showerhead 22 so as to reliably conduct RF power from the top wall to the showerhead. The weight of the showerhead resting on the support shelf helps achieve a reliable, high conductivity electrical connection at the area of contact between the showerhead rim and the support shelf. Therefore, there may be no need to connect a separate electrical cable between the top wall and the showerhead as in the FIG. 2 embodiment.

Unlike the flexible suspensions described in U.S. Pat. No. 6,477,980, there is no need for the hanger 70 to be flexible, because the showerhead rim is free to slide across the support shelf. The hanger 70 can be fabricated together with the top wall 18 as a unitary, monolithic piece, or it can be a separate piece that is bolted to, or otherwise attached to, the top wall 18.

As explained in the preceding Section 2, the gas inlet manifold preferably should provide a sufficiently gas tight seal so as to prevent an excessive portion of the process gas from leaking from the plenum 26. As stated above, the amount of leakage that is excessive depends on the process being performed on the workpiece, but in almost all applications the amount of leakage should be less than 40%, and preferably less than 10%, of the gas flow through the showerhead gas outlet orifices 30. In the FIG. 6 embodiment in which a hanger 70 attaches the showerhead support shelf to the gas inlet manifold top wall 18, the hanger 70 functions as the side wall of the gas inlet manifold, in cooperation with the showerhead support shelf 54 and showerhead rim 52. Therefore, each of these components preferably should not have substantial gaps, either within any one component or between adjacent components, through which more than the aforesaid portion of the process gas can leak from the plenum. Any of these components can be fabricated as one continuous piece, or else can be fabricated as multiple pieces which closely abut to create a sufficient gas seal. Examples of both fabrication approaches are provided in the preceding Section 2.

As explained in the discussion of the embodiments of FIGS. 1-5, the structures that mount and support the showerhead within the vacuum chamber preferably should interpose a high thermal impedance between the showerhead and such cool chamber components. In the embodiment of FIG. 5 having a hanger 70, this can be achieved by maximizing the thermal impedance that the hanger interposes between the showerhead and the top wall 18. Such thermal impedance can be maximized by making the hanger very thin or by fabricating the hanger of a material having a low thermal conductivity such as stainless steel, which has a lower thermal conductivity than most other electrical conductors suitable for use inside a plasma chamber. Our preferred embodiment employs the former approach, i.e., making the hanger thin enough so that it has the desired low thermal conductivity. We recommend fabricating the hanger 70 of an aluminum sheet having a thickness of 3 mm or less, preferably 1 mm or less.

4. Hangers with Pin Sliding in Slot

Figure 7:
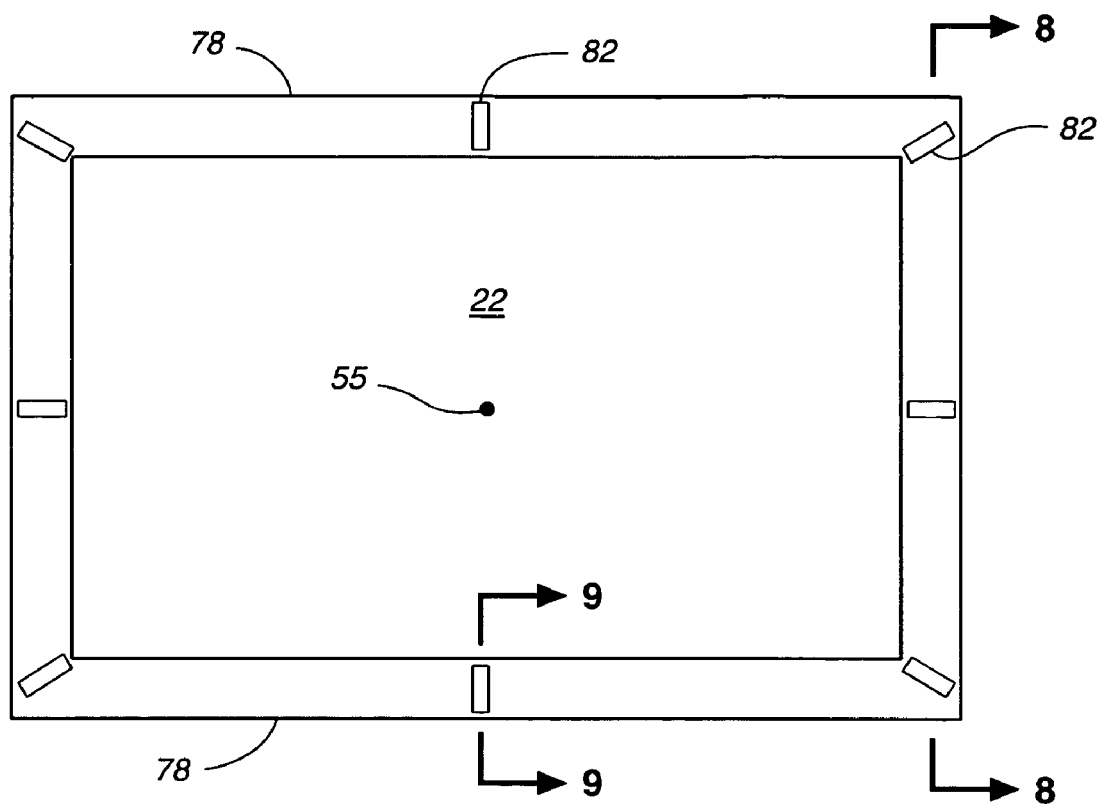
FIG. 7 is a horizontal sectional view of a showerhead having slots for mating with hangers having pins that slide within the slots.
Figure 8:
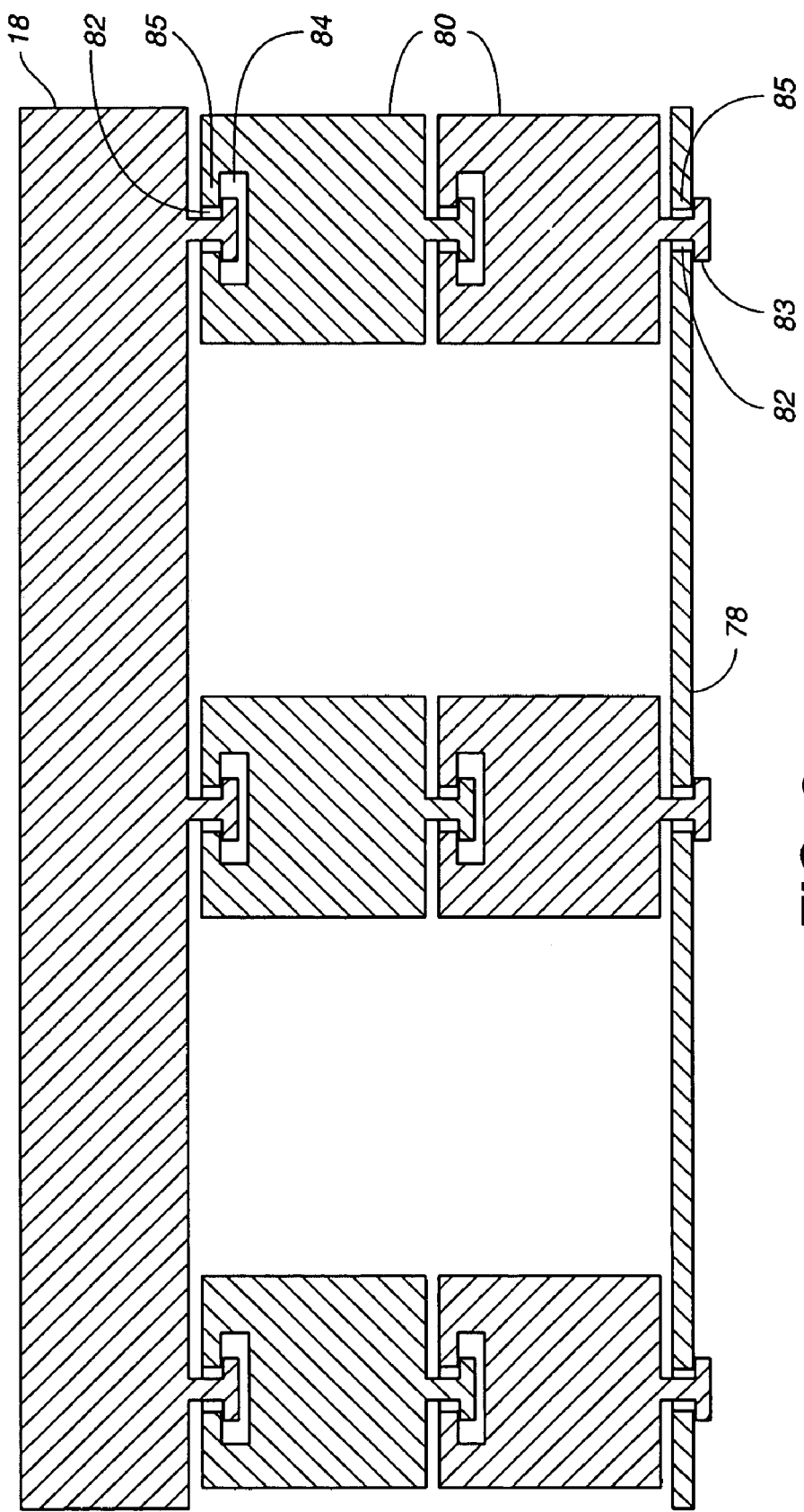
FIGS. 8 and 9 are a vertical sectional view and a vertical sectional detail, respectively, of a showerhead suspended by hangers having pins that slide within slots.
Figure 9:
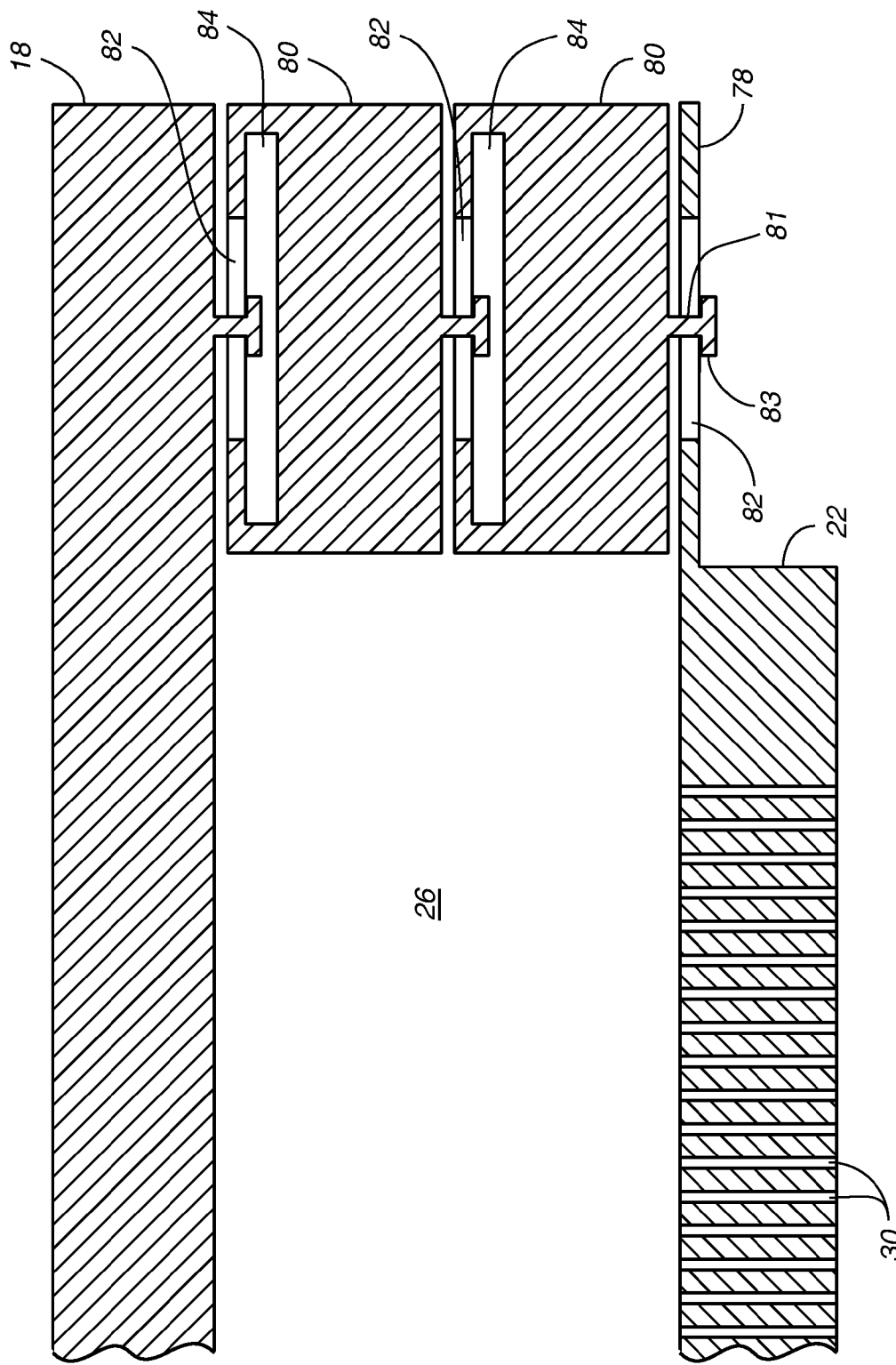

FIGS. 7-9 show an embodiment in which the showerhead 22 is suspended from the top wall 18 of the gas inlet manifold by a suspension that comprises a plurality of hangers 80 that are attached to the showerhead and top wall 18 by pins 81 that slide within slots 82 so as to permit the hangers to slide radially to accommodate thermal expansion of the showerhead in the radial direction.

The upper surface of the showerhead 22 has a plurality of slots 82 at circumferentially distributed locations near the perimeter of the showerhead, as shown in FIG. 7. The longest dimension (length) of each slot extends in a radial direction relative to the longitudinal axis 55 of the showerhead (see FIGS. 1 and 7). Although the slots can be manufactured in the body of the showerhead, it is easier to manufacture the slots in an outwardly extending rim 78 of the showerhead as shown in FIGS. 7-9.

In the illustrated rectangular showerhead, the showerhead has one slot adjacent each of the four corners of its top surface and one slot midway between each of the four corners. Alternatively, the showerhead can include a greater or lesser number of slots, such as only the four slots adjacent the corners, or only the four slots that are midway between the corners, or only two slots at opposite sides of the top surface of the showerhead, or only three circumferentially distributed slots.

For each slot 82 in the showerhead, a corresponding hanger 80 is provided with a pin 81 that extends through the slot. A shoulder 83 extending laterally from the bottom end of the pin 81 is wider than the lateral width of the slot, i.e., the dimension of the slot parallel to the azimuth or perimeter of the showerhead. Consequently, the shoulder 83 engages and supports the underside of the portion 85 of the showerhead that laterally bounds the slot, as shown in FIG. 9. (We refer to the portion of the showerhead that laterally bounds the slot as the slot side wall 85.)

Each pin 81 and its shoulder 83 can have any cross-sectional shape, such as a circular or rectangular cross section. For example, each pin could be implemented as a threaded bolt, and the shoulder of each pin could be the head of the bolt.

The hangers 80 that directly engage and support the showerhead as just described are referred to as the first or lowermost "layer" of hangers. In one possible embodiment, the suspension includes only a single layer of hangers, in which case each of the hangers should be tall enough to extend between the showerhead 22 and the top wall 18.

More preferably, the suspension includes multiple layers of hangers 80 as shown in FIGS. 8 and 9, so that if the number of layers is an integer N, the height of each hanger is approximately the distance between the showerhead and the top wall divided by N. In the illustrated embodiment, there are two layers of hangers between the showerhead and the top wall; i.e., N=2.

The upper surface of each hanger 80 has a slot 82 having the same orientation as the corresponding slot in the showerhead. Specifically, the slot of each hanger has its longest dimension oriented parallel to a radius of the showerhead, i.e., perpendicular to the longitudinal axis 55 (FIG. 1) of the showerhead. Directly below and contiguous with the slot 82, each hanger also has a groove 84 that is wider than the shoulder 83 of the pin 81 that extends through the slot, so as to provide a cavity through which the shoulder 83 can slide while the pin slides within the slot.

The lower surface of the gas inlet manifold top wall 18 includes a number of downward projecting pins 81 equal to the number of hangers 80 in the uppermost layer. The pins 81 are located at circumferentially distributed positions near the perimeter of the top wall so that a distinct pin on the top wall 18 engages each hanger in the uppermost layer. The lower surface of each hanger also has a downward projecting pin 81.

Each pin 81 of the top wall and each pin 81 of the hangers has a shoulder 83 as described above.

Each pin of the top wall 18 passes through the slot 82 of its corresponding hanger 80. We refer to the slot of each hanger as having a side wall 85 like the side wall 85 of each slot of the showerhead. That is, we refer to the portion of the hanger that laterally bounds the slot 82, and vertically overhangs the groove 84, as the slot side wall 85. The slot side wall 85 of each hanger rests on the shoulder 83 of the pin 81 that passes through the slot because the shoulder of the pin is wider than the transverse width of the slot, as shown in FIG. 9. Consequently, the pin and shoulder support the side wall 85 of the slot, which in turn supports the hanger of which it is a part.

Likewise, if there is more than one layer of hangers, each hanger in the one or more layers above the lowermost layer supports the hanger below it because each such hanger has a pin that passes through the slot of the hanger immediately below it, and each pin has a shoulder 83 that is wider than the transverse width of the corresponding slot 82 of the hanger immediately below it.

Consequently, the shoulders and pins of the hangers of the lowermost layer collectively support the entire weight of the showerhead. The shoulders and pins of the top wall collectively support the weight of the uppermost layer of hangers. The shoulders and pins of each layer of hangers other than the lowermost layer collectively support the weight of the next layer of hangers immediately below it.

Because the pins and slots permit each hanger to slide radially relative to the showerhead below and the gas inlet manifold top wall above, the showerhead can freely expand and contract in response to temperature changes.

Figure 10:
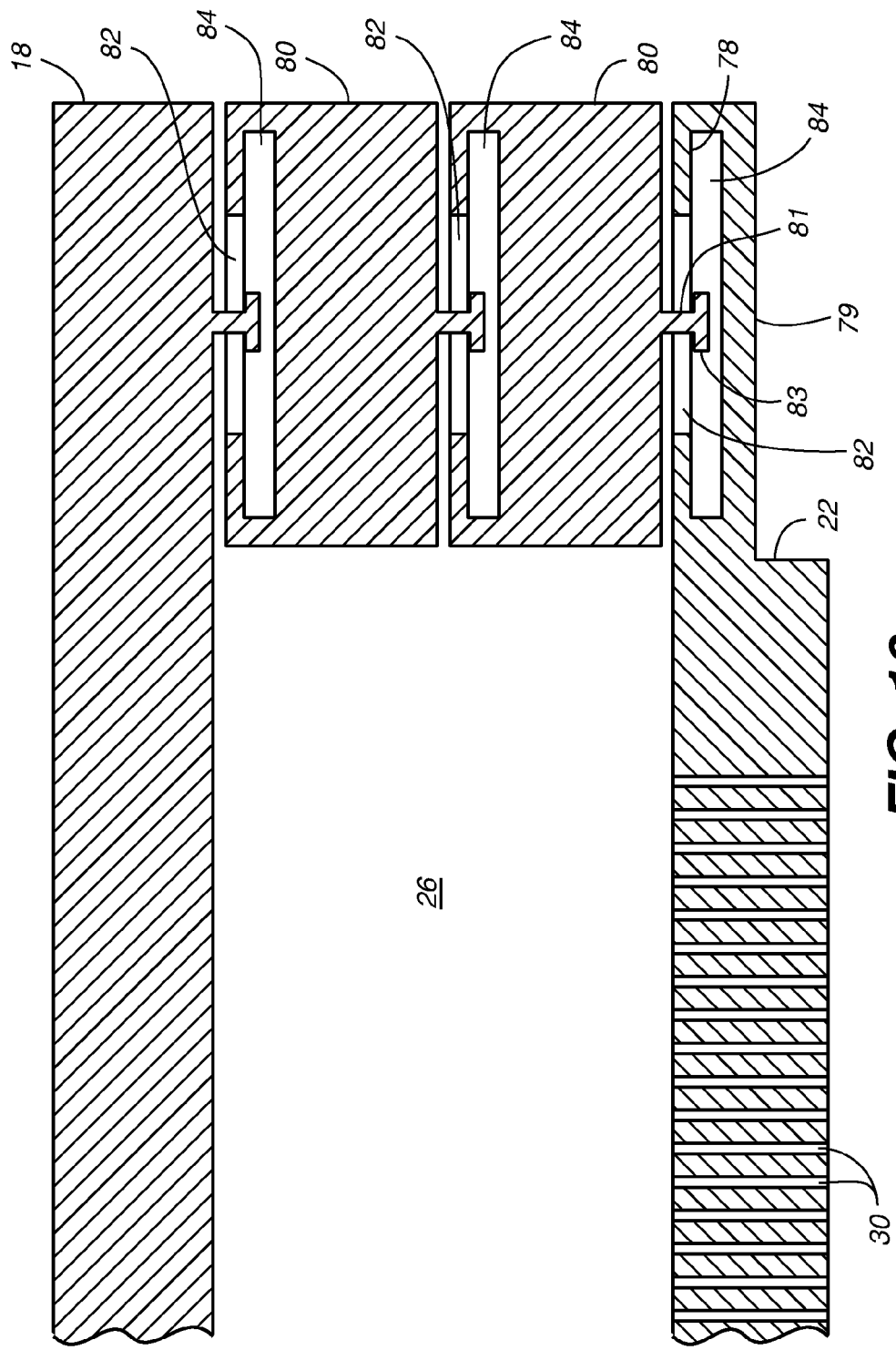
FIG. 10 is a vertical sectional detail of a variation on the embodiment of FIG. 9 in which the showerhead rim includes a groove to catch particles.

FIG. 10 illustrates that, if it is desired to catch particles generated by abrasion between the showerhead rim 78 and the shoulders of the pins on which it rests, the rim can be modified to include: (1) a groove 84 below the slot 82, and (2) a solid portion 79 below the groove.

Figure 11:
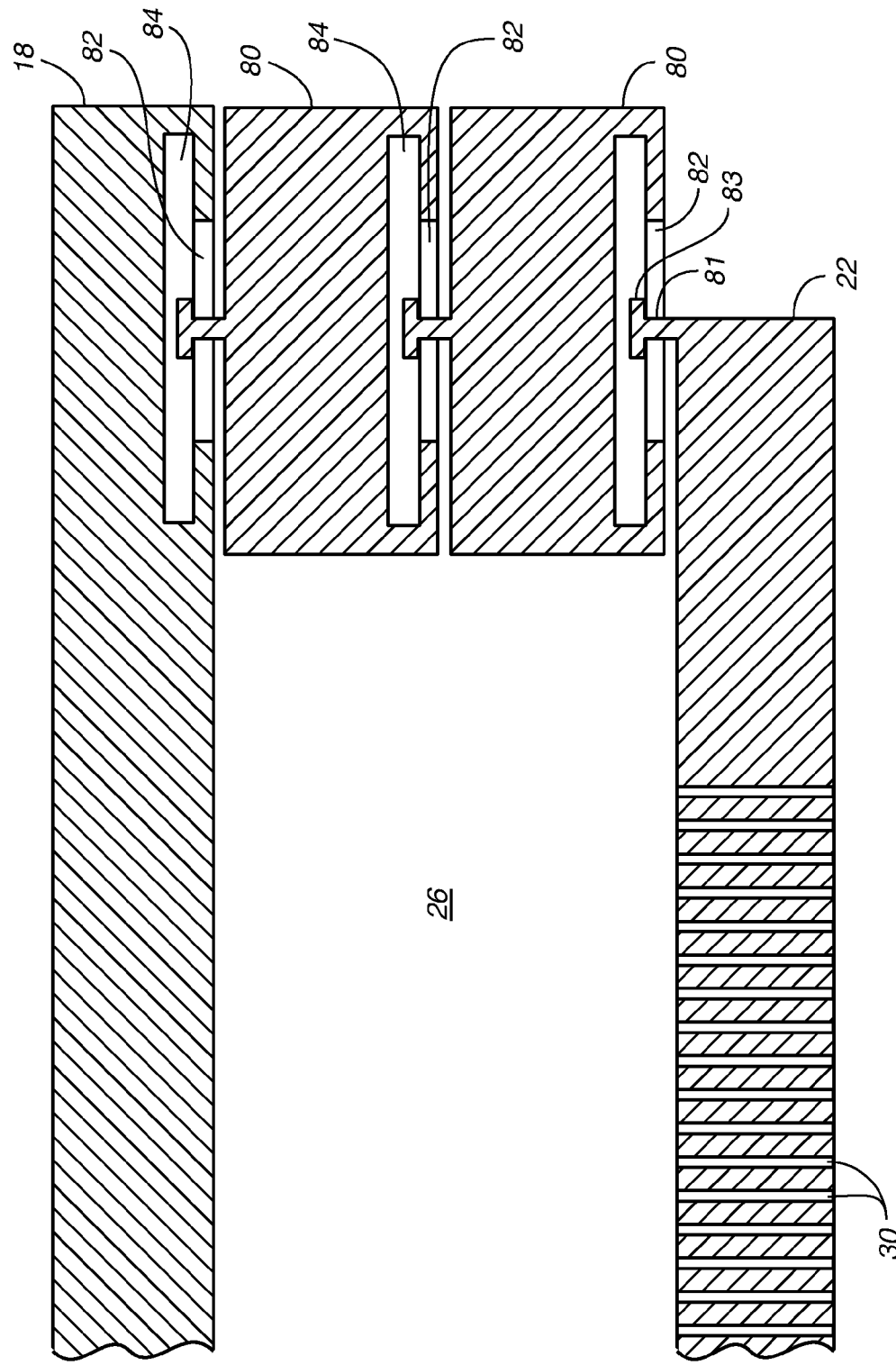
FIG. 11 is a vertical sectional detail of a variation on the embodiment of FIG. 9 in which the pins and slots are inverted.

FIG. 11 shows an alternative embodiment in which the pins and slots are inverted relative to the embodiments illustrated in FIGS. 7-10, so that each pin 81 extends upward into the slot 82 of the hanger 80 or top wall 18 above it, and so that the underside of the shoulder 83 of each pin rests on, and is supported by, the slot side wall 85 that laterally bounds the slot 82 of the hanger or top wall above it. However, the illustrated embodiment in which each pin 81 extends downward into the slot 82 is preferable because the upward-facing grooves 84 can catch particles generated by abrasion between the shoulder 83 and the side wall 85 of the slot, so that such particles do not fall onto the workpiece.

As stated in the preceding Section 1, one or more process gases are dispensed into the chamber through the gas inlet manifold. The gas inlet manifold includes the gas inlet manifold top wall 18, a showerhead 22 (also called a diffuser or gas distribution plate), and a gas inlet manifold side wall that extends between the top wall 18 and the showerhead so that the gas inlet manifold side wall, top wall and showerhead collectively enclose a volume referred to as the plenum 26 or the interior region of the gas inlet manifold.

In each of the embodiments of FIGS. 8-11, the transverse width of each hanger 80 need not be much greater than the transverse width of the groove 84 within the hanger. (By transverse width we mean the width of the hanger in a direction perpendicular to the direction in which the hanger slides, which is the width of the hanger from left to right in FIG. 8.) Consequently, the hangers 80 may not be wide enough to function as side seals for the gas inlet manifold. That is, if there is a large transverse spacing between adjacent hangers, the hangers will not form a gas-sealing side wall for the gas inlet manifold.

In that case, a gas-sealing side wall for the gas inlet manifold preferably should be formed by attaching one or more gas sealing members 88 between the gas inlet manifold top wall 18 and the showerhead 22. The gas inlet manifold side wall 88 should enclose a volume or plenum 26 that extends between the gas inlet orifice 28 of the top wall 18 and the gas outlet orifices 30 of the showerhead. The gas inlet manifold side wall 88 should be sufficiently flexible to accommodate thermal expansion of the showerhead in the radial direction.

Figure 12:
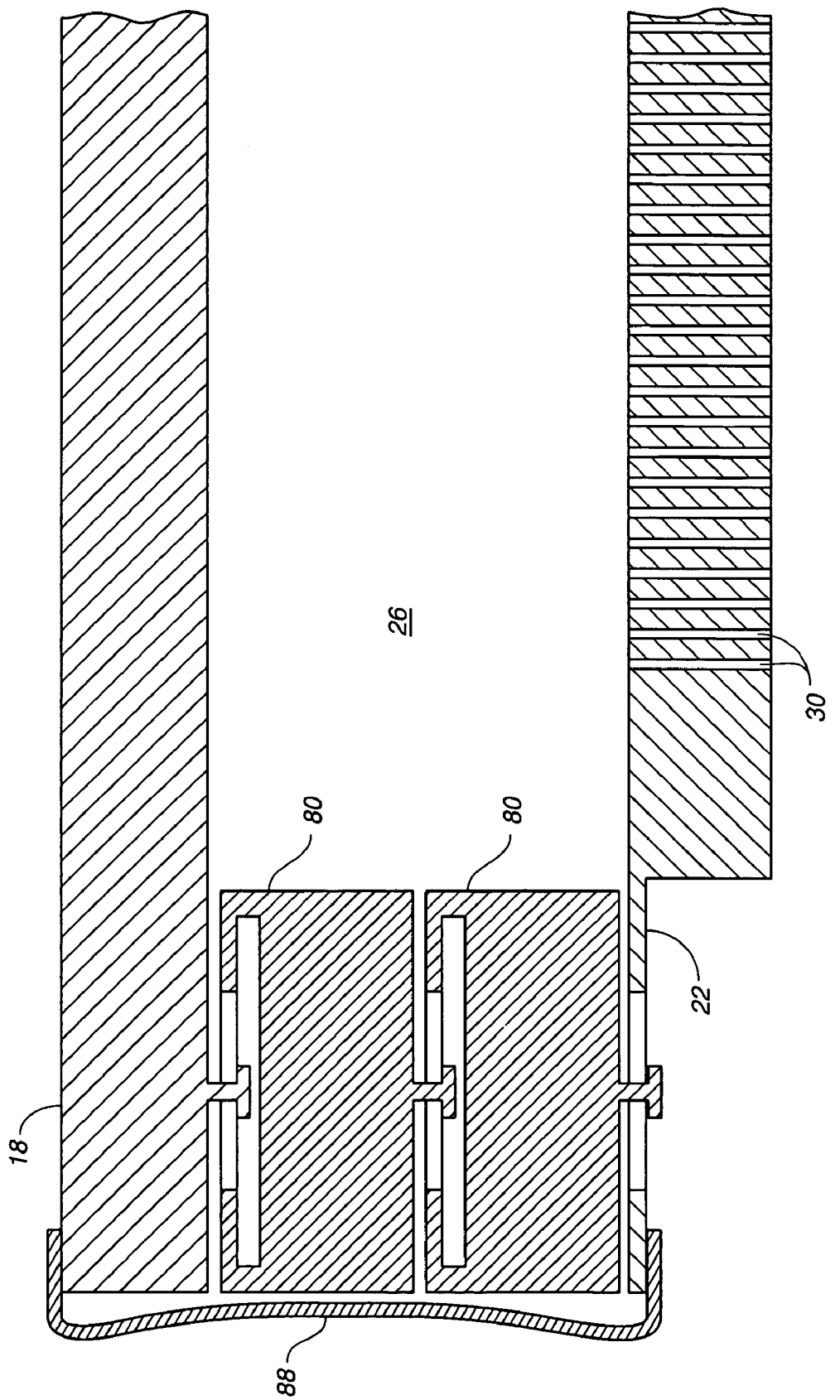
FIG. 12 is a vertical sectional detail of the gas inlet manifold of FIGS. 8 and 9 having a gas seal extending between the rim of the showerhead and the perimeter of the gas inlet manifold top wall.

FIG. 12 shows one suitable gas-sealing side wall for the gas inlet manifold that comprises one or more flexible sheets or membranes 88 that are attached to, and extend between, the perimeter of the gas inlet manifold top wall 18 and the rim 78 of the showerhead 22. The length or height of the sheets or membranes 88 in the direction of the longitudinal axis 55 of the showerhead should be larger than necessary to span the distance between the top wall 18 and the showerhead so that the sheet has sufficient slack or looseness to accommodate thermal expansion of the showerhead. In the case of the illustrated rectangular showerhead, the gas seal 88 can be a single sheet extending around the entire perimeter of the top wall and showerhead, or else it can include four distinct sheets respectively attached to the four sides of the top wall and showerhead.

Figure 13:
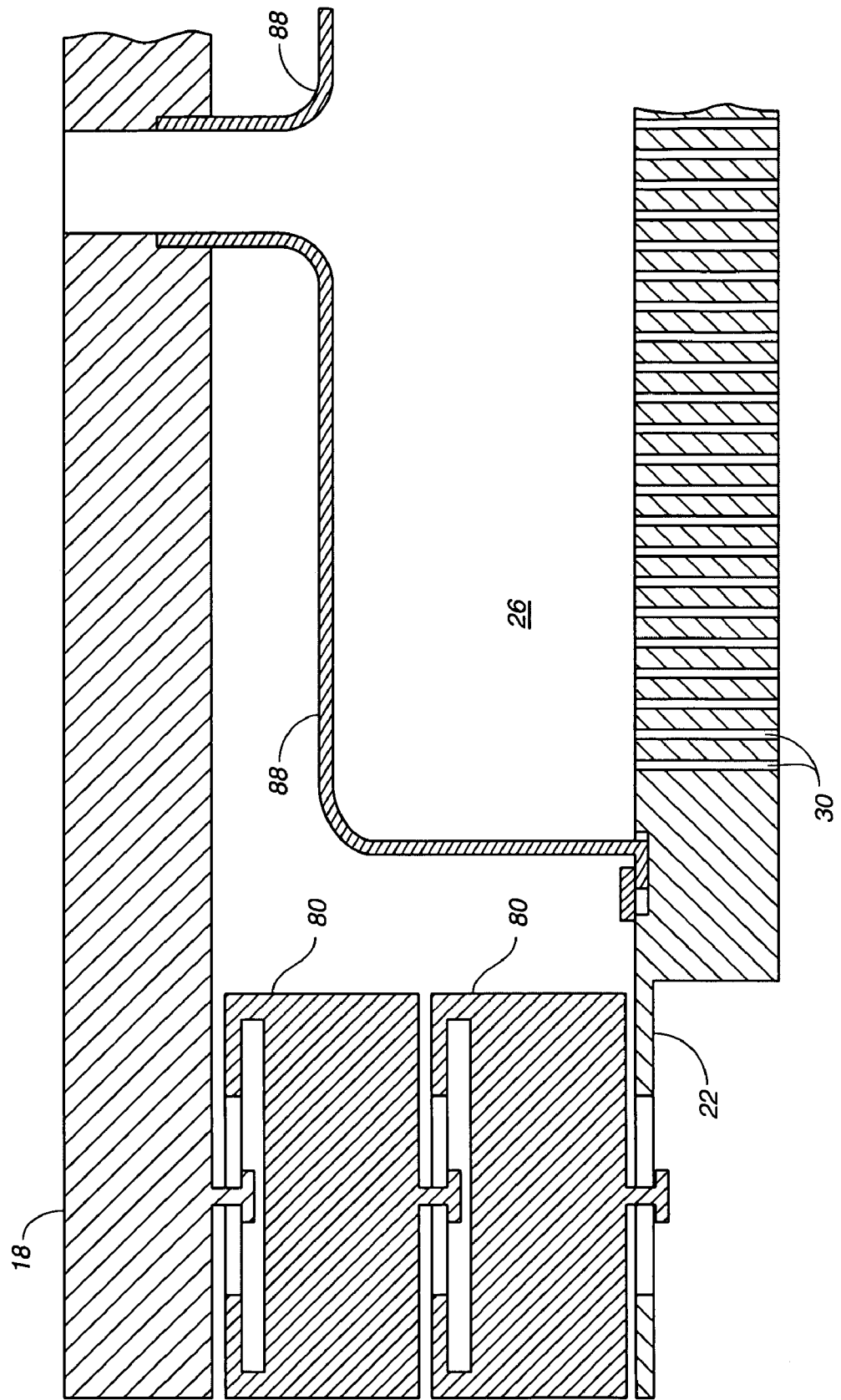
FIGS. 13 and 14 are a vertical sectional detail and an exploded perspective view, respectively, of the gas inlet manifold of FIGS. 8 and 9 having a gas seal attached to the showerhead between the gas outlet orifices and the rim.
Figure 14:
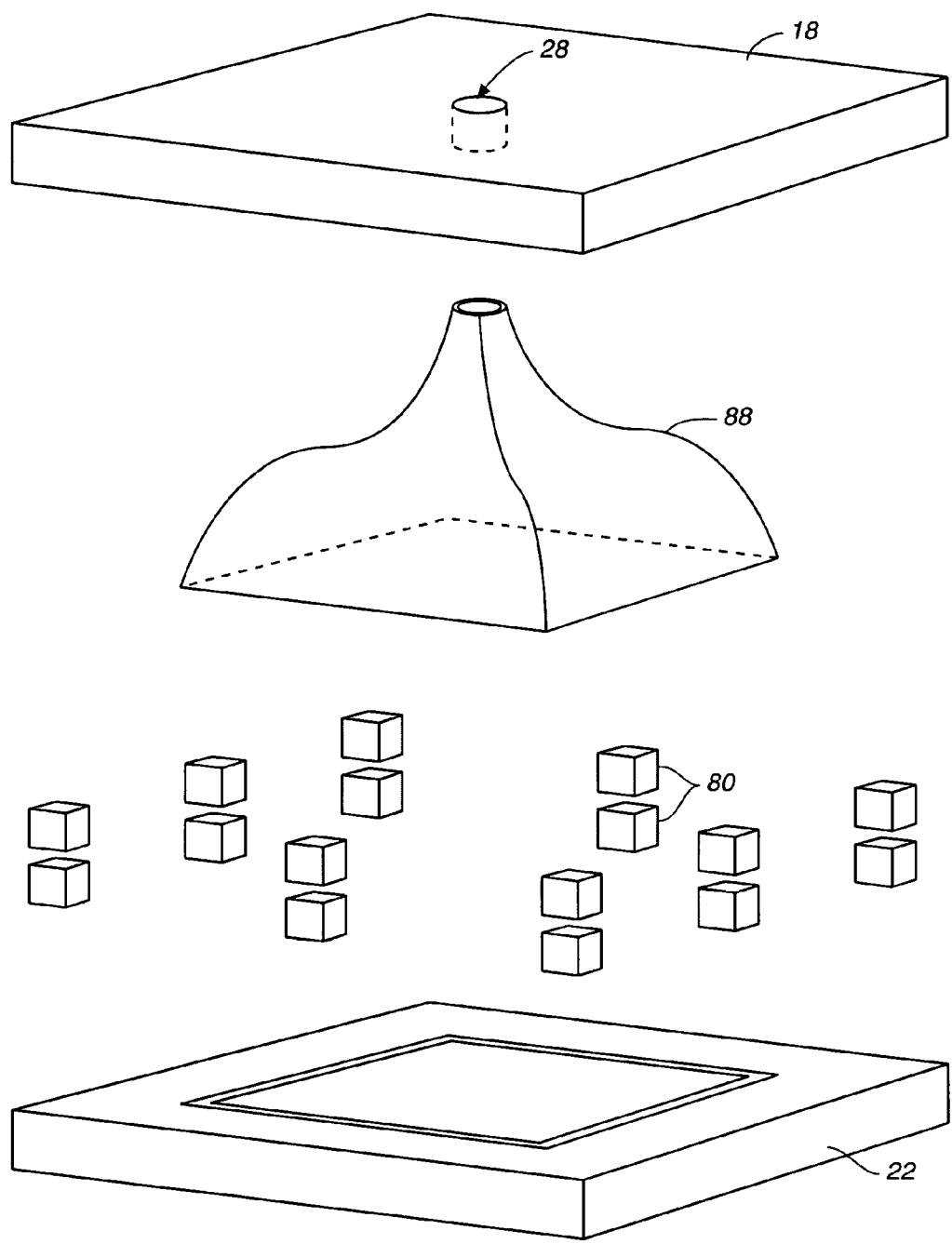

FIGS. 13 and 14 show an alternative embodiment in which the lower end of the flexible sheet or membrane 88 is attached to the showerhead 22 along a surface that is radially inward of the hangers 80 and radially outward of the gas outlet orifices 30.

The weight of the showerhead is supported entirely by the hangers 80, not by the sheet 88. Therefore, the sheet 88 only needs to be strong enough to withstand the pressure differential between the gas supplied to the inlet manifold and the chamber vacuum, rather than being strong enough to support a heavy showerhead. Accordingly, the sheet can be composed of a material that is thin enough to be highly flexible.

Figure 15:
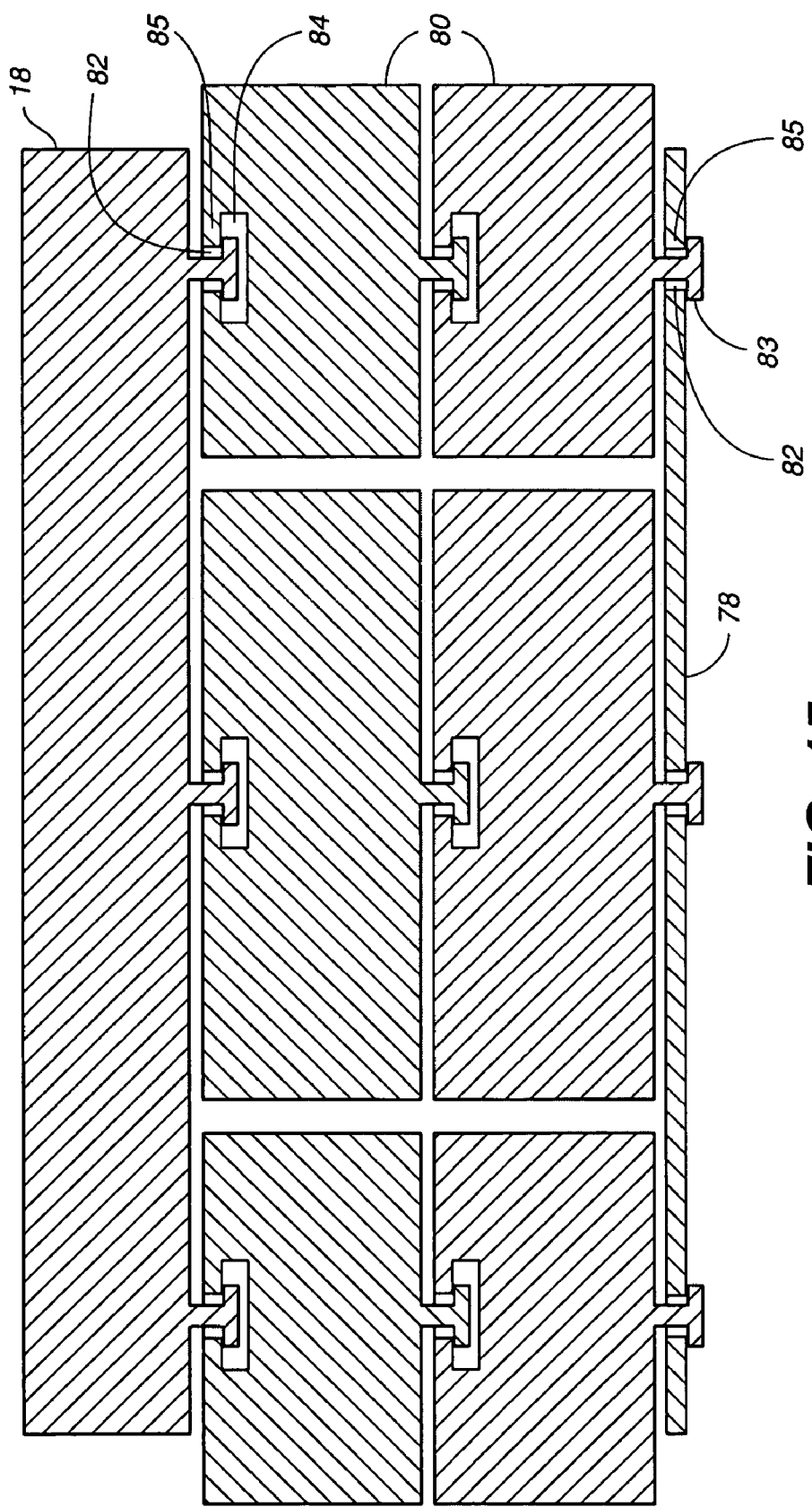
FIG. 15 is a vertical sectional view of a variation of the gas inlet manifold of FIGS. 8 and 9 in which the hangers are wide enough to function as gas sealing side walls of the gas inlet manifold.

FIG. 15 shows an alternative embodiment in which the hangers 80 function as gas-sealing side walls of the gas inlet manifold, eliminating the need for an additional flexible seal 88. This requires each of the hangers 80 to have a transverse width large enough so that the lateral ends of adjacent hangers are sufficiently close to each other to prevent an excessive portion of the process gas in the plenum 26 from leaking through the gaps between the hangers rather than flowing through the gas outlet orifices 30 of the showerhead.

As stated in Section 1, above, the amount of leakage that is acceptable depends on the process being performed on the workpiece, but in most processes the leakage should be less than ten percent. That is, less than ten percent (one-tenth) of the gas entering the plenum 26 through the gas inlet orifice 28 should leak through the gas inlet manifold side wall, so that at least ninety percent of the gas should be dispensed into the vacuum chamber through the gas outlet orifices 30. At worst, no more than forty percent of the gas entering the plenum should leak through the gas inlet manifold side wall.

Preferably, therefore, the transverse width of the hangers should be great enough, and the gaps between hangers should be small enough, so that the combined cross-sectional area of the gaps between hangers (the "side wall gap area") should be less than ten percent (one-tenth) of the combined cross-sectional area of the narrowest portion of the outlet orifices of the showerhead (the "showerhead orifice area"). At worst, the side wall gap area should be less than forty percent of the showerhead orifice area.

Gas leakage through the gaps between lateral ends of adjacent hangers can be further reduced if the adjacent ends of the hangers are attached to flexible seals or bellows (not shown) that bridge the gaps between adjacent hangers.

Figure 16:
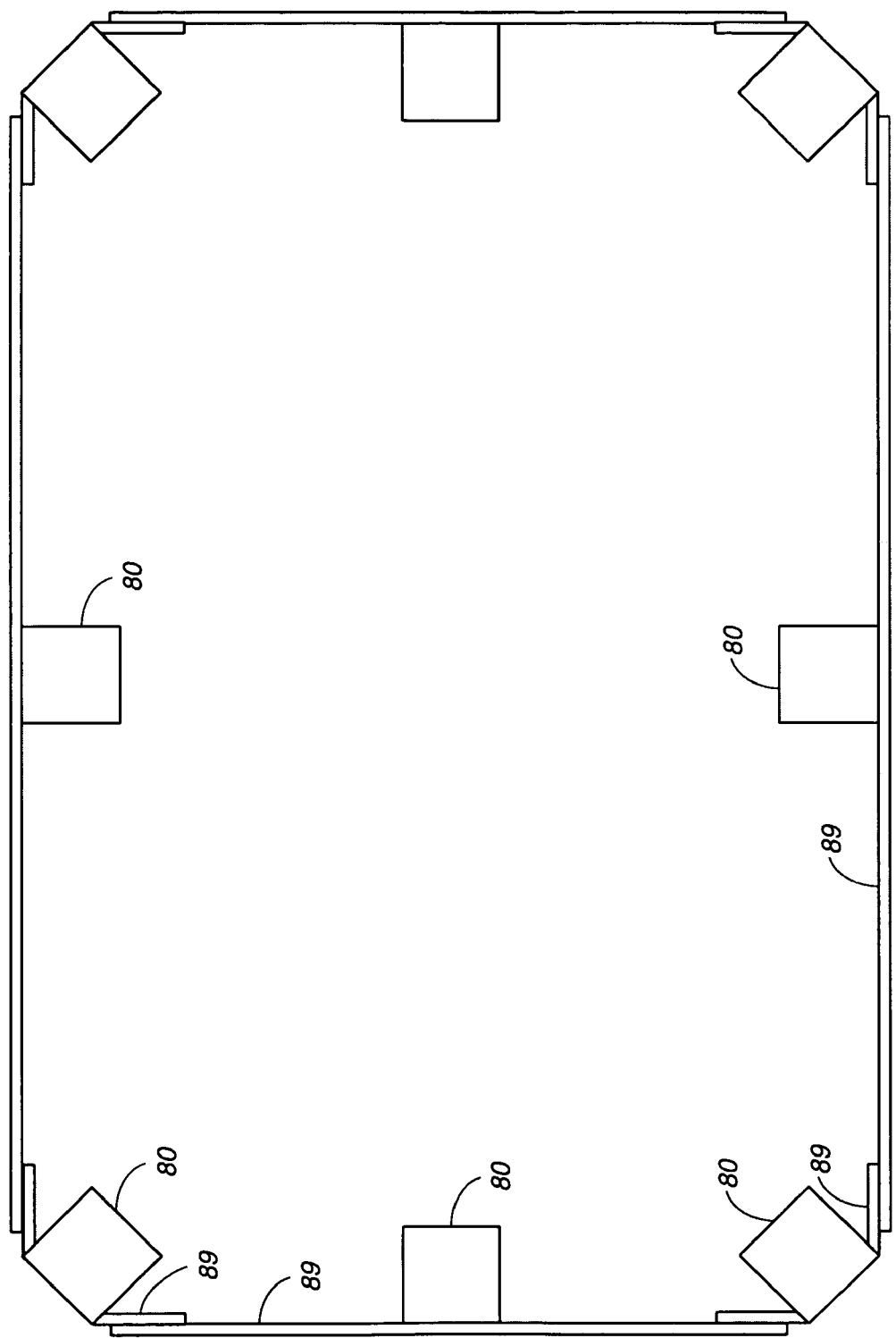
FIG. 16 is a horizontal sectional view of a variation of the gas inlet manifold of FIG. 15 in which the hangers include overlapping lateral extensions.

FIG. 16 shows an alternative design in which the hangers 80 include lateral extensions 89 that are wide enough so that the lateral extensions of every pair of adjacent hangers overlap. Each pair of overlapping extensions should be spaced sufficiently close together so that the gaps between them impede leakage of gas from the plenum so as to prevent more than 40% (two-fifths), and preferably less than 10% (one-tenth), of the gas entering the plenum from leaking through all of said gaps rather than flowing through the gas outlet orifices 30 of the showerhead. Alternatively, the combined cross-sectional area of the gaps between hangers should be less than 40% (two-fifths), and preferably less than 10% (one-tenth), of the combined cross-sectional area of the narrowest portion of the outlet orifices of the showerhead.

5. Wire Suspension

Figure 17:
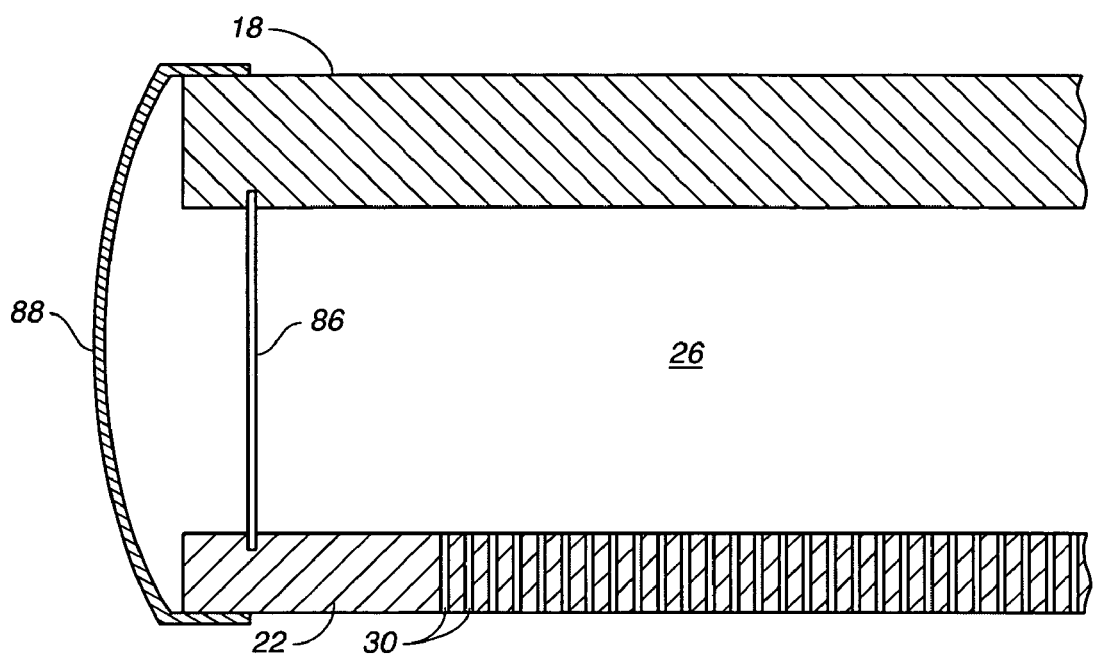
FIG. 17 is a vertical sectional detail of one corner of an embodiment in which the showerhead is suspended by wires from the gas inlet manifold top wall.
Figure 18:
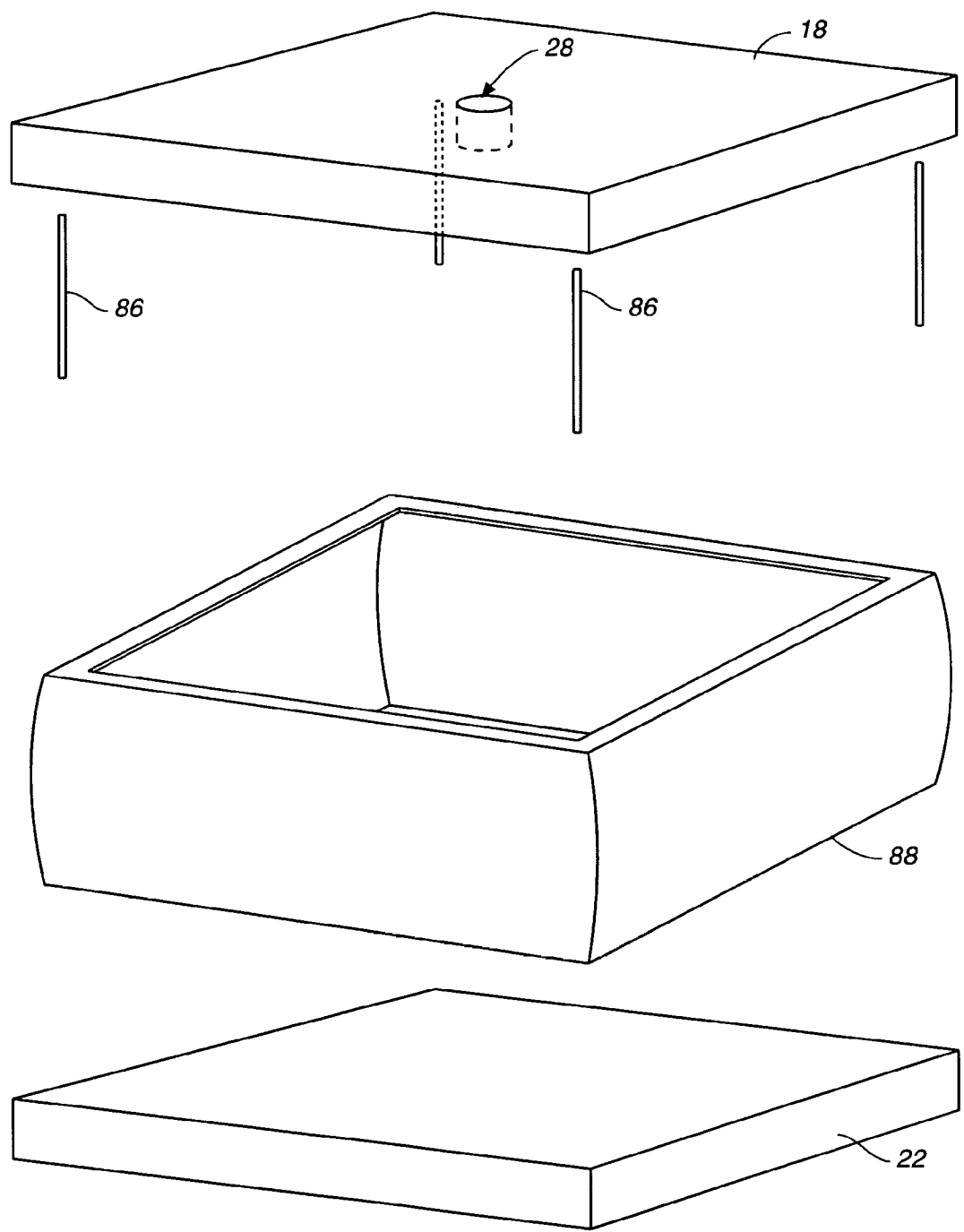
FIG. 18 is an exploded perspective view of only the showerhead, wires, and gas inlet manifold top wall of the embodiment of FIG. 17.

FIGS. 17 and 18 show an embodiment in which the showerhead 22 is suspended by three or more flexible wires 86. The upper end of each wire is attached to a point near the perimeter of the gas inlet manifold top wall 18, and the lower end of each wire is attached to a point near the perimeter of the showerhead. The upper attachment points are circumferentially distributed on the top wall 18, and the lower attachment points are circumferentially distributed on the showerhead.

In the illustrated preferred embodiment, the showerhead and the gas inlet manifold top wall 18 are rectangular, the number of wires is four, and the attachment points of the wires are near the four corners of the showerhead and the gas inlet manifold top wall. (To more clearly show the four wires and their attachment points, FIGS. 17 and 18 omit all components other than the four wires, the showerhead, the gas inlet manifold top wall, and the gas seal 88 described below.)

Because the wires are flexible, the showerhead is free to expand and contract in response to temperature changes without stress.

Preferably, the wires are composed of electrically conductive metal, so that the wires can function to conduct RF power from the gas inlet manifold top wall to the showerhead.

Since the diameter of the wires is a tiny fraction of the transverse width of the showerhead, the wires cannot function as a side wall to enclose the plenum or interior region 26 of the gas inlet manifold. Consequently, a separate gas seal 88 must be provided to enclose the sides of the gas inlet manifold. The gas seal should be sufficiently flexible to accommodate thermal expansion of the showerhead.

Figure 19:
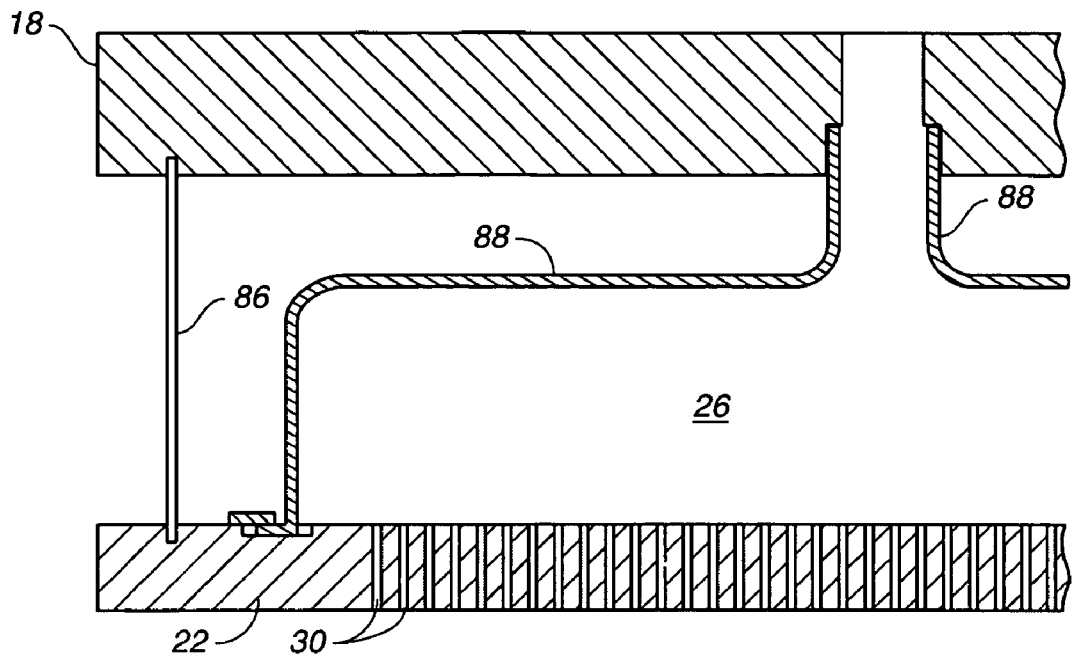
FIG. 19 is a vertical sectional detail of one corner of a variation of the embodiment of FIG. 17 in which the sheet for sealing the sides of the inlet manifold is inward of the suspension wires.

Any of the designs for the gas seal 88 described in Section 4, above (FIGS. 12-14) are equally suitable for use in combination with the wire suspension 86. FIGS. 17 and 18 show a perimeter seal 88 similar to that shown in FIG. 12. FIG. 19 shows an alternative seal 88 attached to the showerhead 22 along a surface that is radially inward of the wires 86 and radially outward of the gas outlet orifices 30, similar to the seal 88 shown in FIGS. 13 and 14.

6. Suspension Rods with Articulating Joints

Figure 20:
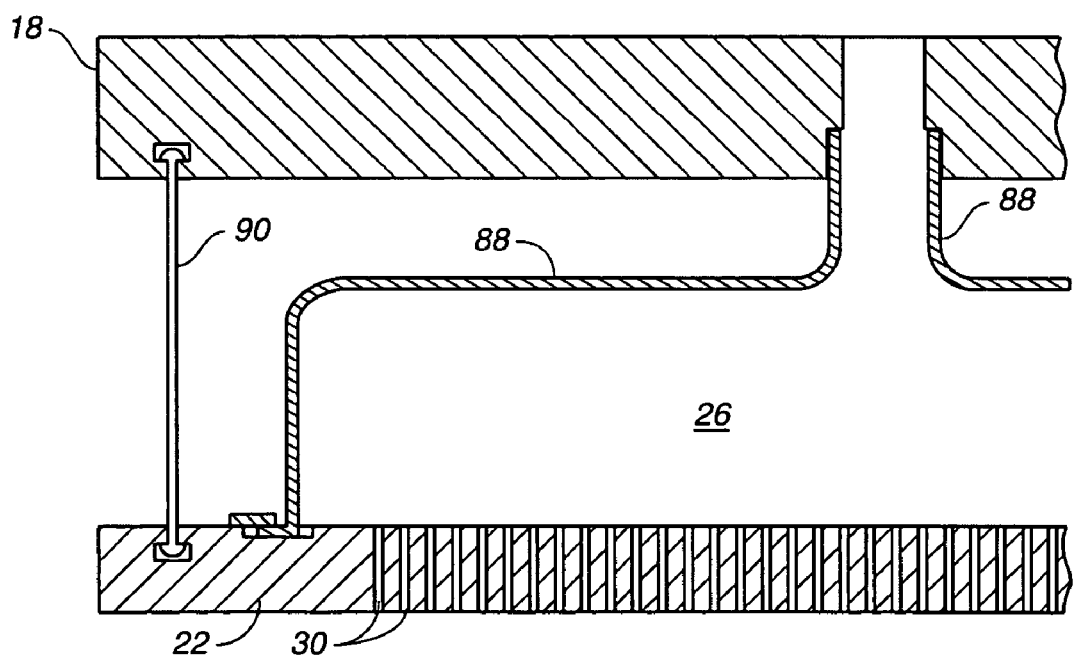
FIG. 20 is a vertical sectional detail of one corner of an embodiment in which the showerhead is suspended by rods mounted with articulating joints.

FIG. 20 shows an embodiment similar to that of FIG. 19, except that the showerhead is suspended by rods 90 instead of wires. The lower and upper ends of each rod are respectively attached to the showerhead and gas inlet manifold top wall by articulating joints 91. The articulating joints eliminate any need for the rods to be flexible, so the rods can be thick and rigid.

The articulating joints can be any conventional design that allows the rod to pivot at the joint, such as a conventional ball and socket joint. A less expensive approximation of a ball and socket joint can use the head of a shoulder screw in place of the ball and a hole or slot in place of the socket, as shown in FIG. 20. The slot can be elongated in a transverse or radial direction to allow the rod to slide transversely or radially in addition to pivoting.

A sheet 88 should be provided to provide a gas seal for the sides of the gas inlet manifold as described in the preceding Section 5, entitled "Wire Suspension."

7. Rigid Mounting to Support with High Thermal Expansion Coefficient

Figure 21:
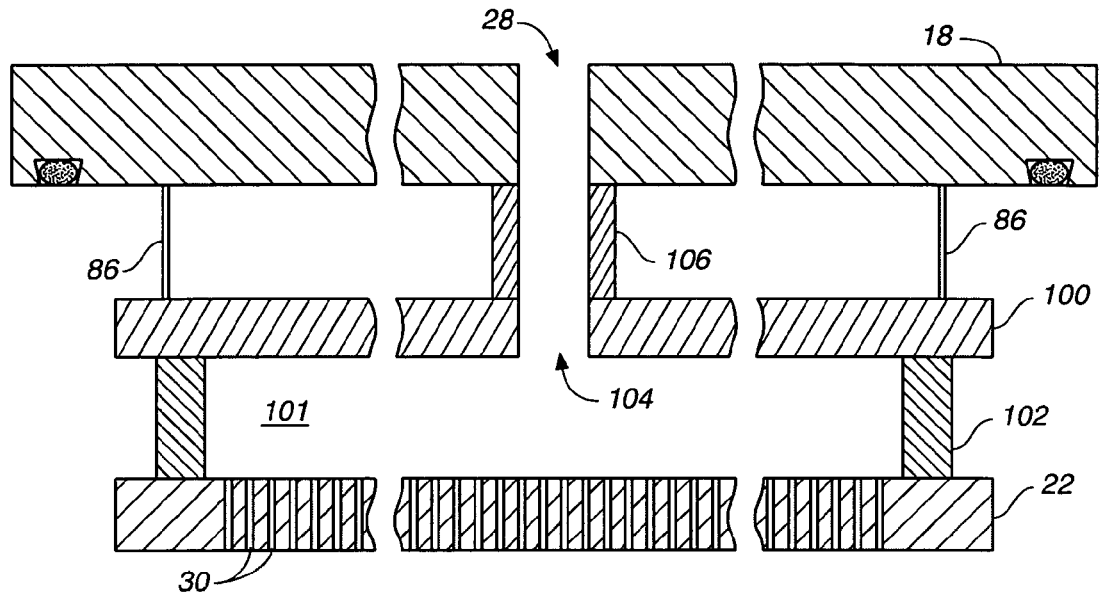
FIGS. 21 and 22 are a vertical sectional view and an exploded perspective view, respectively, of a temperature compensating member and showerhead.
Figure 22:
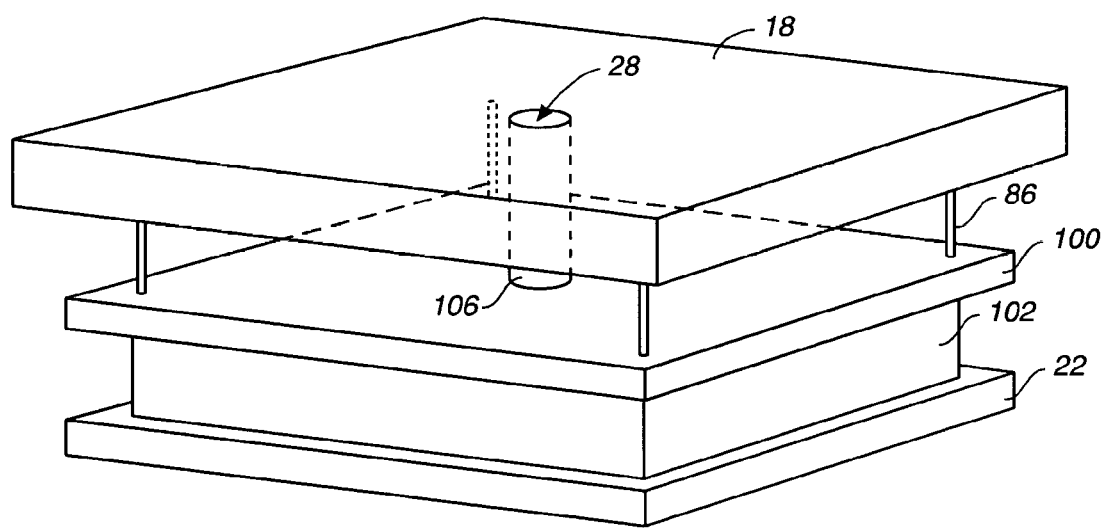

FIGS. 21 and 22 show an alternative design that permits the showerhead to be mounted rigidly, without requiring any flexible or sliding components, yet which reduces stress on the showerhead when it undergoes thermal expansion and contraction in the radial direction. A unique element of this design is the showerhead support member 100 composed of a material that has a higher thermal expansion coefficient than the material of the showerhead 22. The showerhead is rigidly suspended from the high thermal expansion coefficient support member 100. The suspension includes at least one spacer 102, where each spacer has an upper end attached near the perimeter of the support member 100 and a lower end attached near the perimeter of the showerhead 22.

The showerhead support member 100, spacer 102, and showerhead 22 collectively enclose a volume or plenum 101 into which the process gas flows before it is dispensed into the interior of the vacuum chamber through the showerhead gas outlet orifices 30. These components should provide a substantially gas tight seal around the plenum so that no more than a negligible amount of gas leaks from within the plenum to the interior of the vacuum chamber without passing through the showerhead outlet orifices 30.

If the showerhead is circular, the spacer 102 preferably is cylindrical. In the illustrated preferred embodiment, the showerhead is rectangular, and the spacer 102 is a rectangular frame that encircles an open center. Alternatively, multiple spacers 102 can be circumferentially distributed around the perimeter of the showerhead 22, but then a gas seal should be provided between adjacent spacers.

A gas conduit 106 has an upper end attached to the vacuum chamber top wall 18 where it is coupled to the gas inlet orifice 28. The lower end of the gas conduit 106 is attached to the showerhead support member 100 where it is coupled to at least one gas orifice 104 in the showerhead support member. Consequently, the gas conduit 106 provides a path for the process gas to flow from the gas inlet orifice 28, through the gas orifice 104 in the showerhead support member, through the plenum 101, and then through the showerhead gas outlet orifices 30.

The operating principle of this design is as follows. Thermal conduction and convection through the process gas within the plenum 101 functions to transfer heat between the showerhead 22 and the showerhead support member 100. Therefore, the temperature of the showerhead support member 100 increases and decreases when the temperature of the showerhead increases and decreases. The spacer 102 also may transfer heat between the showerhead and the support member. Because the heat transfer through the gas and the spacer is less than 100 percent efficient, the support member generally will be cooler than the showerhead. Therefore, if the support member and the showerhead had the same thermal expansion coefficient, the support member would not expand and contract as much as the showerhead in response to heat from the process being performed in the chamber.

According to our invention, however, the thermal expansion coefficient of the support member 100 should exceed the thermal expansion coefficient of the showerhead by an optimum amount, so that the support member will expand radially by approximately the same amount as the showerhead. In other words, the support member 100 should be composed of a material whose thermal expansion coefficient exceeds that of the showerhead by an optimum amount so that the support member expands radially by an amount approximately equal to the radial expansion of the showerhead in response to its higher temperature. The optimum thermal expansion coefficient of the support member can be determined empirically by fabricating the support member 100 of different materials and selecting the material that causes the support member to expand and contract by approximately the same amount as the showerhead in response to temperature changes likely to be encountered during processes performed in the chamber.

Because the gas conduit 106 is attached to the showerhead support member near the center of the support member 100, the radial expansion of the support member at that point is negligible in comparison with its radial expansion near its perimeter. Therefore, the gas conduit can be rigidly attached to the showerhead support member. In one contemplated embodiment, the gas conduit supports the entire weight of the showerhead support member and the showerhead. More preferably, additional support for the weight of the heater and showerhead can be provided by attaching any of the flexible or sliding suspensions described in the preceding Sections 2-6 between the perimeter of the support member 100 and the top wall 18. Alternatively, any of the flexible suspension designs described in the two above-referenced U.S. Pat. Nos. 6,477,980 and 6,772,827 can be attached between the support member 100 and the top wall 18. In the preferred embodiment shown in FIGS. 21 and 22, such support is provided by four flexible wires 86 that are respectively attached to the four corners of the showerhead, as in the embodiment of FIGS. 17-19 described in Section 5.

The gas conduit 106, support member 100, and spacer 102 can function to conduct RF power from the chamber top wall 18 to the showerhead if they all are composed of electrically conductive material. Because each of these components can be rigidly attached, each of the attachment points described above readily can be implemented so as to provide good RF electrical conductance.

8. Heater Behind Showerhead

The various suspension designs described above are intended to prevent stress due to the radial expansion and contraction of the showerhead in response to increases and decreases in the temperature of the entire showerhead. An additional problem not fully addressed by the preceding designs is that the front (lower) surface of the showerhead generally will be hotter than the back (upper) surface of the showerhead because the front surface faces the major sources of heat in the chamber: (1) the workpiece support 12, which typically includes a heater to heat the workpiece 10; and (2) in the case of a plasma process, the plasma in the region between the showerhead and the workpiece support. In contrast, the back surface of the showerhead is exposed to surfaces that typically are cooler than the showerhead, such as the top wall 18 of the gas inlet manifold.

When the front surface of the showerhead is hotter than the back surface, the front surface will expand more than the back surface, causing the showerhead to bow outward toward the source of heat. That is, the front surface becomes more convex. As stated above under the heading "Background of the Invention," any change to the contour (flatness or curvature) of the front surface of the showerhead is undesirable because it can impair the spatial uniformity of the process being performed on the workpiece.

Figure 23:
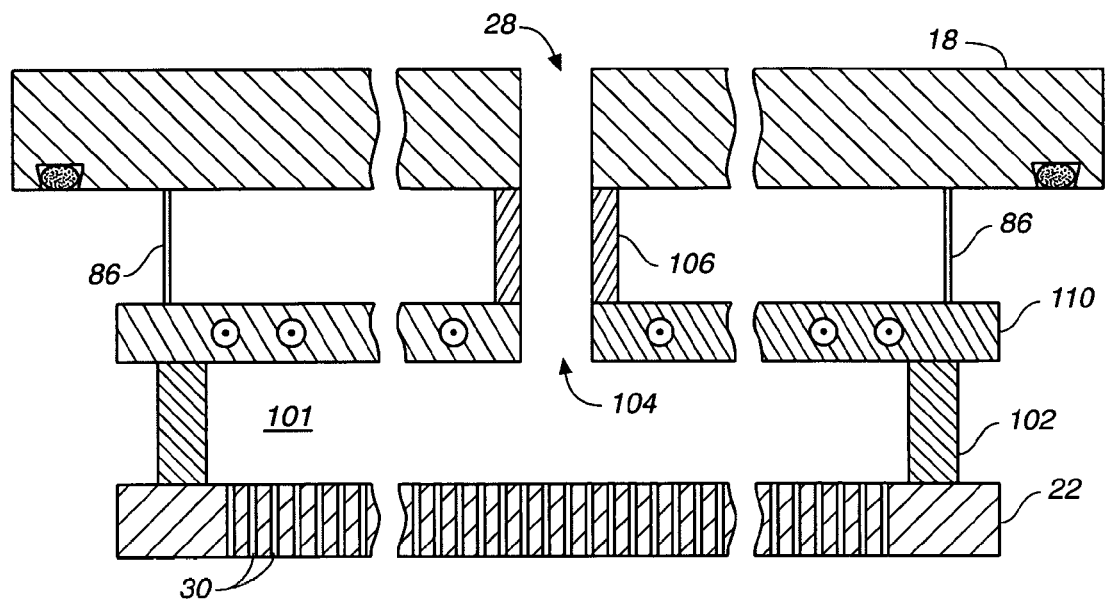
FIG. 23 is a vertical sectional view of a heater and showerhead.

FIG. 23 shows a solution to the bowing problem. The FIG. 23 design is similar to the design shown in FIG. 16, except that the showerhead support member 100 having a high temperature coefficient is replaced by a heater 110. The heater overcomes the problem of the showerhead having a cooler back surface than front surface by providing heat to the back surface of the showerhead. The heater has the additional advantage of elevating the temperature of the entire showerhead, which can be beneficial to reduce heat loss from the workpiece.

The heater can employ any conventional source of heat, such as an electrical heating element embedded in the body of the heater, or else channels for pumping a hot fluid through the body of the heater. Heat is transferred from the heater 110 to the back surface of the showerhead 22 by radiation and by conduction and convection through the process gas flowing through the plenum region 101 between the heater and the showerhead. These heat transfer mechanisms are good enough so that it is not necessary for the spacer 102 to be a good thermal conductor.

The temperature of the showerhead will be almost the same as, or just slightly cooler than, that of the heater because of the heat transfer described in the preceding paragraph. Therefore, if the body of the heater is composed of a material having the same, or slightly lower, thermal expansion coefficient as the showerhead, the heater and the showerhead will undergo approximately the same amount of radial expansion in response to temperature. Consequently, the spacer 102 can be rigidly attached between the heater and the showerhead.

The heater 110 should have at least one gas orifice 104 like the gas orifice 104 of the showerhead support 100 described in Section 7, above. Likewise, as described in Section 7, a gas conduit 106 can be rigidly attached between the vacuum chamber top wall 18 and the heater 110 to both support the weight of the heater and showerhead and to convey process gas from the gas inlet orifice 28, through the gas orifice 104 of the heater, through the plenum 101, and then through the showerhead outlet orifices 30 into the chamber interior.

The gas conduit 106, heater 110, and spacer 102 can function to conduct RF power from the chamber top wall 18 to the showerhead if they all are composed of electrically conductive material. Because each of these components can be rigidly attached, each of the attachment points described above readily can be implemented so as to provide good RF electrical conductance.

The spacer 102 can be implemented as described above in Section 7 so as to form a substantially gas tight enclosure for plenum 101 in combination with the heater 110 and the showerhead 22. As also described in Section 7, additional support for the weight of the heater and showerhead can be provided by attaching any of the flexible or sliding suspensions described in the preceding Sections 2-6 between the perimeter of the heater and the top wall 18. Alternatively, any of the flexible suspension designs described in the two above-referenced U.S. Pat. Nos. 6,477,980 and 6,772 827 can be attached between the heater 110 and the top wall 18. In the preferred embodiment illustrated in FIG. 23, such support is provided by four flexible wires 86 respectively attached between the four corners of the rectangular heater 110 and the top wall 18.

Alternatively, the suspension wires 86 shown in FIG. 23 can be replaced by one of the suspensions described in the preceding Sections 2-4 in which the members that support the showerhead (support shelf 54 or hangers 70 or 80), in combination with the chamber wall 18, sealingly enclose a gas inlet manifold plenum 26. In such case, there would be no need for an additional sealed conduit 106. This alternative would be especially useful if it were desired to provide a plurality of spatially distributed gas orifices 104 in the heater in order to achieve a desired spatial distribution or mixture of the process gas in the plenum 101.

More generally, in any of the designs for flexible or sliding suspensions described in the preceding Sections 2-6 or in the aforesaid previous patent applications, the showerhead 22 described therein can be replaced by the entire assembly described in this Section 8 comprising the heater 110, spacer 102, and showerhead 22. Where a flexible or sliding suspension member or hanger is attached to the showerhead in one of the preceding designs, such suspension member or hanger can instead be attached to the heater 110, spacer 102, or showerhead 22 in the assembly described in this Section 8.

The invention claimed is:

1. A method of dispensing gas into a vacuum chamber, comprising the steps of:
   providing a vacuum chamber having a chamber wall that encloses a chamber interior;
   positioning a shelf within the chamber interior, wherein the shelf has an upward facing surface;
   providing a showerhead having a radially outer perimeter, a rim that includes said radially outer perimeter, an upper surface, a lower surface, and one or more gas orifices extending between the upper surface and the lower surface, wherein the rim of the showerhead includes a downward facing surface;
   positioning the showerhead within the chamber interior so that the downward facing surface of the rim of the showerhead rests on the upward facing surface of the shelf and so that the rim of the showerhead is free to slide along the upward facing surface of the shelf; and
   flowing gas through the gas orifices of the showerhead into the chamber interior.

2. A method according to claim 1, wherein the mounting step further comprises:
   covering a surface of the chamber wall that faces the chamber interior with a dielectric liner;
   wherein the dielectric liner includes said shelf.

3. A method according to claim 1, wherein:
   the showerhead is rectangular;
   the rim is rectangular and has four sides; and
   the shelf comprises four distinct pieces that respectively abut the four respective sides of the rim.

4. A method according to claim 1, wherein the shelf is one continuous piece.

5. A method according to claim 1, wherein:
   the shelf comprises a plurality of pieces separated by gaps; and
   the gaps between adjacent pieces of the shelf have a combined cross-sectional area that is less than one-tenth of the combined cross-sectional area of the narrowest portion of each of the outlet orifices of the showerhead.

6. A method according to claim 1, further comprising the steps of:
   providing one or more gas inlet orifices within the chamber wall;
   providing said shelf so that said shelf comprises a plurality of pieces; and
   connecting an outer portion of each piece of the shelf to the chamber wall so that the chamber wall, the showerhead, and the pieces of the shelf collectively enclose a volume that is in fluid communication with the gas inlet orifices of the chamber wall and the gas outlet orifices of the showerhead;
   wherein the step of flowing gas through the gas orifices of the showerhead comprises the step of flowing an amount of gas through the gas inlet orifices into said volume; and
   wherein adjacent pieces of the shelf are separated by gaps that are sufficiently small so that, during the step of flowing said amount of gas through the gas inlet orifices, at least ninety percent of said amount of gas flows through the gas outlet orifices.

7. A method according to claim 1, wherein:
   the chamber wall includes a gas inlet manifold top wall having at least one gas inlet orifice; and
   the step of positioning said shelf includes the step of providing a hanger having an upper portion connected to the gas inlet manifold top wall and having a lower portion connected to the shelf.

8. A method according to claim 7, wherein the gas inlet manifold top wall, the hanger, the shelf, the showerhead rim, and the showerhead are each electrically conductive and are connected together in series so as to provide an electrically conductive connection between the gas inlet manifold top wall and the showerhead.

9. A method according to claim 1, wherein:
   the showerhead is not supported at its rim by any portion of the vacuum chamber other than said shelf.

10. A method according to claim 1, wherein:
   the showerhead is not supported at its rim by any structure other than said shelf.

11. A method according to claim 1, wherein:
   the showerhead is not supported at its rim other than by said shelf.

12. A method of dispensing gas into a vacuum chamber, comprising the steps of:
   providing a vacuum chamber having a gas inlet and having a chamber wall that encloses a chamber interior;
   positioning a shelf within the chamber interior, wherein the shelf has an upward facing surface;
   providing within the chamber interior a showerhead having:
      (i) a central portion that includes an upper surface, a lower surface, and one or more gas passageways extending between the upper surface and the lower surface, wherein the gas passageways are in fluid communication with the gas inlet so as to conduct gas flow from the gas inlet through the gas passageways into the chamber interior, and
      (ii) a rim that is radially outward of the central portion, wherein the rim of the showerhead includes a downward facing surface, and wherein the rim does not include any gas passageway that conducts gas flow from the gas inlet through the rim into the chamber interior;
   resting the downward facing surface of the rim of the showerhead on the upward facing surface of the shelf so that the rim of the showerhead is free to slide along the upward facing surface of the shelf; and
   flowing gas from the gas inlet through the gas passageways of the showerhead into the chamber interior.

13. A method according to claim 12, wherein:
   the shelf comprises a plurality of pieces separated by gaps; and
   the gaps between adjacent pieces of the shelf have a combined cross-sectional area that is less than one-tenth of the combined cross-sectional area of the narrowest portion of each of the outlet orifices of the showerhead.

14. A method according to claim 12, further comprising the steps of:

providing one or more gas inlet orifices within the chamber wall;

providing said shelf so that said shelf comprises a plurality of pieces; and connecting an outer portion of each piece of the shelf to the chamber wall so that the chamber wall, the showerhead, and the pieces of the shelf collectively enclose a volume that is in fluid communication with the gas inlet orifices of the chamber wall and the gas outlet orifices of the showerhead;

wherein the step of flowing gas through the gas orifices of the showerhead comprises the step of flowing an amount of gas through the gas inlet orifices into said volume; and wherein adjacent pieces of the shelf are separated by gaps that are sufficiently small so that, during the step of flowing said amount of gas through the gas inlet orifices, at least ninety percent of said amount of gas flows through the gas outlet orifices.

15. A method according to claim 12, wherein:
the showerhead is not supported at its rim by any portion of the vacuum chamber other than said shelf.

16. A method according to claim 12, wherein:
the showerhead is not supported at its rim by any structure other than said shelf.

17. A method according to claim 12, wherein:
the showerhead is not supported at its rim other than by said shelf.

18. A method according to claim 12, wherein:
the rim of the showerhead is not supported by any portion of the vacuum chamber other than said shelf.

19. A method according to claim 12, wherein:
the rim of the showerhead is not connected to any portion of the vacuum chamber other than said shelf.

20. A method according to claim 12, wherein:
the shelf comprises a plurality of distinct pieces.

\* \* \* \* \*